(12) United States Patent
Beeson et al.

(10) Patent No.: US 9,277,620 B2
(45) Date of Patent: Mar. 1, 2016

(54) WAVELENGTH CONVERSION CHIP FOR USE WITH LIGHT EMITTING DIODES AND METHOD FOR MAKING SAME

(75) Inventors: Karl W. Beeson, Princeton, NJ (US); Scott M. Zimmerman, Baskin Ridge, NJ (US); William R. Livesay, San Diego, CA (US)

(73) Assignee: Goldeneye, Inc., San Diego, CA (US)

( * ) Notice: Subject to any disclaimer, the term of this patent is extended or adjusted under 35 U.S.C. 154(b) by 167 days.

(21) Appl. No.: 13/507,596

(22) Filed: Jul. 11, 2012

(65) Prior Publication Data

US 2012/0280264 A1    Nov. 8, 2012

Related U.S. Application Data

(63) Continuation of application No. 12/806,484, filed on Aug. 12, 2010, now Pat. No. 8,232,534, which is a continuation-in-part of application No. 11/389,311, filed on Mar. 24, 2006, now Pat. No. 7,285,791.

(51) Int. Cl.
*H01L 33/50* (2010.01)
*H05B 33/10* (2006.01)

(52) U.S. Cl.
CPC .............. *H05B 33/10* (2013.01); *H01L 33/508* (2013.01); *H01L 2924/0002* (2013.01); *H01L 2933/0041* (2013.01)

(58) Field of Classification Search
USPC .................................................. 313/498–512
See application file for complete search history.

(56) References Cited

U.S. PATENT DOCUMENTS

| | | | |
|---|---|---|---|
| 6,565,770 B1 | 5/2003 | Mayer et al. | |
| 6,630,691 B1 | 10/2003 | Mueller-Mach et al. | |
| 6,667,574 B2 | 12/2003 | Aoki et al. | |
| 6,696,703 B2 | 2/2004 | Mueller-Mach et al. | |
| 7,812,516 B2 * | 10/2010 | Maruyama et al. | 313/503 |
| 2004/0140765 A1 * | 7/2004 | Takekuma | 313/512 |
| 2005/0006659 A1 | 1/2005 | Ng et al. | |
| 2005/0196886 A1 * | 9/2005 | Jager et al. | 438/22 |
| 2005/0269582 A1 * | 12/2005 | Mueller et al. | 257/94 |
| 2006/0012299 A1 * | 1/2006 | Suehiro et al. | 313/512 |
| 2006/0138937 A1 * | 6/2006 | Ibbetson | 313/502 |
| 2007/0159060 A1 * | 7/2007 | Shimizu et al. | 313/498 |
| 2008/0149166 A1 * | 6/2008 | Beeson et al. | 136/248 |
| 2008/0252212 A1 * | 10/2008 | Suehiro et al. | 313/512 |
| 2009/0096370 A1 * | 4/2009 | Murazaki et al. | 313/504 |
| 2011/0273083 A1 * | 11/2011 | Yun et al. | 313/506 |

\* cited by examiner

*Primary Examiner* — Ashok Patel
(74) *Attorney, Agent, or Firm* — William Propp, Esq.

(57) ABSTRACT

A solid-state light source has a wavelength conversion chip affixed to a light emitting diode. Optical coatings, vias, light extraction elements, electrical connections or electrical bond pads can be fabricated on the wavelength conversion chips.

1 Claim, 25 Drawing Sheets

WAVELENGTH CONVERSION CHIP FOR USE WITH LIGHT EMITTING DIODES AND METHOD FOR MAKING SAME

CROSS REFERENCE TO RELATED APPLICATIONS

This application is a continuation of U.S. patent application Ser. No. 12/806,484 entitled "WAVELENGTH CONVERSION CHIP FOR USE WITH LIGHT EMITTING DIODES AND METHOD FOR MAKING SAME" filed Aug. 12, 2010, which is a continuation-in-part of U.S. patent application Ser. No. 11/389,311 entitled "WAVELENGTH CONVERSION CHIP IN SOLID-STATE LIGHTING AND METHOD FOR MAKING SAME," filed Mar. 24, 2006, and claims benefit therefrom. U.S. patent application Ser. No. 11/975,406, titled "Wavelength Conversion Chip For Use With Light Emitting Diodes And Method For Making Same", filed on Oct. 19, 2007, was a continuation-in-part of prior U.S. patent application Ser. No. 11/389,311 entitled "Wavelength Conversion Chip In Solid-State Lighting And Method For Making Same," filed Mar. 24, 2006.

TECHNICAL FIELD

A chip containing a wavelength conversion material and a method for making the chip. The chip can be used in conjunction with a light emitting diode (LED) to convert light emitted by the LED into another wavelength.

BACKGROUND

The recent proliferation of solid-state lighting has created a need for high performance wavelength conversion materials. The standard approach is to form wavelength conversion materials (e.g. phosphors) using solid state processing as known in the art. These phosphors are then ground down to powders in the micron size range and deposited on a surface using a variety of deposition techniques such as settling, encapsulation, and spray coating. Large extended area devices such as cathode ray tubes (CRTs), fluorescent lighting, and plasma displays require a large amount of standard high volume phosphors. These phosphors can be acquired for less than $100/Kg for the large extended area devices. Though relatively inexpensive, the phosphors generated using this method suffer from high levels of dislocations and lattice defects. In addition, the compositional purity is also difficult to maintain. In the majority of cases, this does not represent a major problem because of the reduced excitation levels. It has been shown, however, in accelerated aging studies that very high excitation levels can degrade the output luminescence of powdered phosphors severely and impact overall life performance. These levels of high excitation exist within solid-state lighting applications. This is mainly due to the small size and concentrated flux density of the LED die itself. It is also true that in the case of individual or arrays of LEDs, phosphor usage is measured in milligrams rather than grams. It is apparent that higher performance wavelength conversion materials are needed and can be afforded for applications like solid-state lighting. The expense of higher performance materials can be absorbed and even offset if the problems associated with the degradation and reduced conversion efficiency of phosphors used in solid-state lighting can be overcome.

Several material characteristics contribute to this degradation and/or loss in efficiency problem such as lattice defects, out-gassing, and compositional purity. It has been shown that polycrystalline and mono-crystalline phosphor films either grown on a substrate or as single crystal boules tend to exhibit much better luminosity and life characteristics than powders. In addition, every phosphor has a thermal quenching level that can degrade the output at the temperatures created by elevated excitation levels. In the case of powdered phosphors, this can be a major issue because the phosphor particles are usually isolated from any reasonable thermal conduction path. At very high excitation levels the energy associated with less than unity quantum efficiency and Stokes shift losses can induce a significant localized thermal rise within the phosphor particles. The need exists for creation of an improved thermal conduction path for the luminescent material. Also, because the particles are roughly spherical the packing density can be significantly degraded. This affects the tradeoff between maximum absorption/conversion of the excitation energy and reabsorption of the emitted light. The scattering created by the use of a powder can reduce the overall light output due to the backscattering and subsequent absorption of the generated light.

Mueller-Mach et al. in U.S. Pat. No. 6,696,703 disclose the deposition of a thin film phosphor directly on the LED die. However, as-deposited thin film phosphors have relatively poor wavelength conversion efficiency. A high-temperature annealing step is required in order to properly activate the phosphor. This annealing step can damage the semiconductor layers of the LED. In addition, the absorption cross-sections of most thin film phosphors are low, especially for blue and near ultraviolet (UV) excitations typically used within solid-state lighting. It is neither economical nor practical in most cases to create a sufficiently thick layer of luminescent material directly on the LED. Another drawback to depositing a phosphor directly on the LED die is that a large portion of the light generated within a deposited phosphor layer can be trapped due to total internal reflectance. The need therefore exists for a method to utilize high performance phosphors within an LED package such that the best phosphor can be used efficiently (e.g. with sufficient quantity, minimal backscatter, and maximum light extraction). The need also exists for a method to fabricate high efficiency phosphors without damaging the LED semiconductor layers.

Another important aspect of phosphors relates to characterization and overall device efficiency. Phosphors are typically characterized in terms of quantum efficiency and Stokes shift losses. As an example, a powder phosphor layer is deposited on a glass surface and excited. The luminescence is measured as a function of excitation energy and the result is usually compared to a standard phosphor of known quantum efficiency. The losses associated with Stokes shift can be subtracted and the result would be the intrinsic quantum efficiency. Several problems exist with this method of characterization such as backscattered light, coating thickness variability and light trapping. In the case of phosphor powders, the majority of the generated light can escape from the phosphor particles due to their substantially spherical nature and to scattering centers located on or in the material itself. The main problem measuring the efficiency of phosphor powders is backscattering of the light from thick samples. For deposited phosphor films or grown phosphor boules, however, the problem of measuring the phosphor efficiency is affected by light extraction. The majority of the light generated in the phosphor can be trapped within the material itself due to total internal reflection. Several approaches have been used to solve the total internal reflection problem including various roughening techniques and shaping approaches. In these cases, the overall efficiency becomes as much a function of the extraction means as the conversion efficiency. Deposited phosphor films have the added complication of a secondary substrate material with its associated indices and losses.

Mayer et al. in U.S. Pat. No. 6,565,770 describe thin interference pigment flakes that can be made on a flexible substrate and then mechanically removed by flexing the substrate. The dichroic reflectors discussed are used in security enhancement on money and other decorative optical effects. The use of luminescent materials is discussed but is related to the formation of a particular optical effect such as UV illumination for security markings. No explanation for improving the output efficiency of LEDs or other light emitting devices is discussed and no device based on integrating the phosphor layer with the excitation source to form an efficient solid-state lighting element is disclosed.

The use of flake-like phosphors is also discussed by Aoki et al. in U.S. Pat. No. 6,667,574 for use in plasma displays, but the patent again lacks any reference to solid-state lighting applications or methods to enhance their output. In addition, the above two applications are very much cost driven because of the large areas typically required in making a plasma display or the marking of money or decorative items. In order to maximize the performance of these wavelength-converting materials high temperature processing is preferred.

Mueller-Mach et al. in U.S. Pat. No. 6,630,691 disclose a thin single-crystal phosphor substrate onto which an LED structure is fabricated by epitaxial growth techniques. However, single-crystal phosphor substrates are expensive and finding a single crystal phosphor substrate that has the proper lattice match to allow the growth of the LED structure can be difficult.

Ng et al. in US Patent Application No. 20050006659 disclose a planar sheet of a single-crystal phosphor that is placed over the output surface of an LED as a portion of a preformed transparent cap. However, single-crystal phosphor sheets must be grown by epitaxial processes or sliced from bulk single crystals of phosphor material. Single crystal phosphor sheets are therefore too expensive for most practical applications. Planar sheets of polycrystalline phosphors are not disclosed in US Patent Application No. 20050006659. Bonding the planar sheet of a single-crystal phosphor directly to the surface of the LED to improve heat dissipation in the phosphor sheet is also not disclosed.

A need exists to maximize the efficiency of wavelength conversion materials within a solid-state lighting application and to improve the thermal conductivity properties of the materials. In addition, a need exits for low-cost phosphors that have light extraction enhancements and the ability to control the level and type of scatter within the phosphor in order to enhance the overall conversion efficiency.

SUMMARY OF THE INVENTION

The objective of this invention is a high performance wavelength conversion chips for solid-state lighting applications. One embodiment of this invention relates to a high performance wavelength conversion layer on a substrate, then removing the wavelength conversion layer from the substrate in a manner that creates thin wavelength conversion chips of luminescent material that can then be attached intimately to LEDs.

Another embodiment of this invention is a wavelength conversion chip that optionally includes an optical coating on at least one surface the chip. Example optical coatings include reflective coating layers that are wavelength dependent or polarization dependent and photonic bandgap coatings. Also included in this invention is the incorporation of single or multilayered antireflection coatings on the surface of the wavelength conversion chips in order to reduce Fresnel effects on one or more surfaces.

A wavelength conversion chip optionally includes one or more vias that are fabricated through the wavelength conversion chip is another embodiment of this invention. The vias allow for the attachment of electrical connections to the upper surface of the LED.

Another embodiment of this invention is a method for fabricating a wavelength conversion chip that includes optional light extraction elements that allow light to easily exit from the chip, leading to improved efficiency. The use of structures within or on the wavelength conversion chip as well as a variety of sub-wavelength optical elements within or on the chip can be used to induce controlled scatter or directional scatter.

Another embodiment of this invention is a wavelength conversion chip that includes an electrical connection and/or an electrical bond pad.

The wavelength conversion chip is bonded to the emitting surface of an LED to form a solid-state light source is another embodiment of this invention. Because the wavelength conversion chip is attached directly to the LED, the ability to conductively cool the wavelength conversion chip is vastly improved over a powder phosphor.

Another embodiment of this invention is a solid-state light source that includes a stack of wavelength conversion chips bonded to an LED. The stack of wavelength conversion chips can each be fabricated from the same wavelength conversion material or the chips can be fabricated from different wavelength conversion materials. The stack allows for an improved thermal conduction path from each wavelength conversion chip to the LED. The LED itself has a heat sink to maintain the LED die at a low temperature during operation.

The wavelength conversion chip can be attached to an LED by a transparent and thermally conducting bonding layer. Multiple wavelength conversion chips can be attached in a stack using multiple transparent bonding layers. Since the wavelength conversion material is no longer a light scattering powder, a further advantage of this approach is the reduction of backscatter of excitation light due to the reduction in scattering centers. It is also possible to form a much more effective refractive index match to the LED die itself. Total internal reflection within the LED die can be frustrated and the extraction of photons normally trapped within the LED die can be improved. Bonding materials can include transparent conducting oxides, inorganic glasses and polymer materials such as epoxies, acrylates, halogenated polymers, sol-gels, silicones, and xerogels.

BRIEF DESCRIPTION OF THE DRAWINGS

A more detailed understanding of the present invention, as well as other objects and advantages thereof not enumerated herein, will become apparent upon consideration of the following detailed description and accompanying drawings, wherein:

FIGS. 3A-3F are side cross-sectional views illustrating process steps needed to fabricate a wavelength conversion chip that includes light extracting elements and a through via.

DETAILED DESCRIPTION OF THE PREFERRED EMBODIMENTS

Figure 1A:
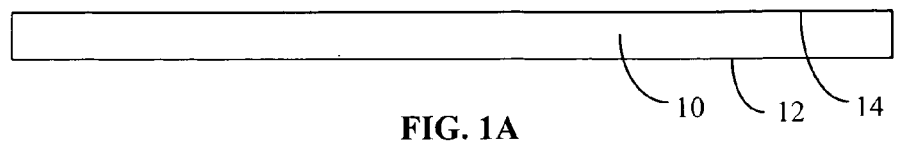
FIGS. 1A-1E are side cross-sectional views illustrating process steps needed to fabricate a wavelength conversion chip.

The preferred embodiments of the present invention will be better understood by those skilled in the art by reference to the above listed figures. The preferred embodiments of this invention illustrated in the figures are not intended to be exhaustive or to limit the invention to the precise form disclosed. The figures are chosen to describe or to best explain the principles of the invention and its applicable and practical use to thereby enable others skilled in the art to best utilize the invention. The above listed figures are not drawn to scale. In particular, the thickness dimensions of the LEDs and wavelength conversion chips are expanded to better illustrate the various internal layers of the devices.

An important solid-state light source is a blue or ultraviolet emitting LED used in conjunction with one or more wavelength conversion materials such as phosphors or quantum dots that convert at least some of the blue or ultraviolet light to other wavelengths. For example, combining a yellow phosphor with a blue emitting LED can result in a white light source. The yellow phosphor converts a portion of the blue light into yellow light. Another portion of the blue light bypasses the yellow phosphor. The combination of blue and yellow light appears white to the human eye. Alternatively, combining a green phosphor and a red phosphor with a blue LED can also form a white light source. The green phosphor converts a first portion of the blue light into green light. The red phosphor converts a second portion of the blue light into red light. A third portion of the blue light bypasses the green and red phosphors. The combination of blue, green and red light appears white to the human eye. A third way to produce a white light source is to combine blue, green and red phosphors with an ultraviolet LED. The blue, green and red phosphors convert portions of the ultraviolet light into, respectively, blue, green and red light. The combination of the blue, green and red light appears white to the human eye.

In a typical solid-state light source of the prior art, powdered phosphor materials are mixed into a polymer host material and applied to the LED as a thin coating or as a lens-shaped element. This results in wavelength conversion elements that can degrade under intense illumination and that have poor thermal conductivity to the LED.

Solid-state light sources that are fabricated by depositing a thin layer of a phosphor directly on the surface of the LED also have significant deficiencies. It is important to separate the processes for making the wavelength conversion layers from the processes for fabricating the LED. Some steps required for optimizing the wavelength conversion layers, such as thermal annealing, may be incompatible with maintaining the output performance of the LED. Forming and optimizing the wavelength conversion layers separately from the LED fabrication overcomes such incompatibilities.

One embodiment of this invention is a process for forming high performance wavelength conversion chips that are fabricated separately from the LED sources and that can be subsequently bonded onto the light output surfaces of LEDs. The process can be a batch process or a continuous web process. The resulting wavelength conversion chips are substantially planar in order to facilitate bonding to the LEDs. The length and width dimensions of the wavelength conversion chips can be greater than, equal to or smaller than the length and width dimensions of the LEDs onto which the chips will be attached.

The first step in the process for forming wavelength conversion chips is to select a substrate 10, which is shown in a side cross-sectional view in FIG. 1A. The substrate provides a physical support for the subsequent deposition of the wavelength conversion layer. Substrate 10 has a bottom surface 12 and a top surface 14 opposite bottom surface 12. Substrate 10 can be a polymeric material or an inorganic material. The material of substrate 10 can be amorphous, polycrystalline or a single-crystal and can be a heterogeneous material or a homogeneous material. If substrate 10 is a polymeric material or a thin flexible metal layer, substrate 10 can be a web that allows for a continuous web process. Depending on the later process steps, the substrate 10 may need to be transparent to light so that a laser liftoff process can be used to remove any deposited wavelength conversion layer. If a mechanical or chemical process is used in later steps to remove any deposited wavelength conversion layer from substrate 10, then substrate 10 does not need to be transparent. Example transparent polymeric materials include, but are not limited to, polyethylene and polyethylene terephthalate (PET). Example flexible metals include stainless steel, molybdenum and graphite. Example transparent inorganic materials include, but are not limited to, sapphire, silica and silicate glasses. Optionally, the top surface 14 of substrate 10 may include a release layer (not shown) to facilitate the removal of any subsequently deposited materials. The release layer is removed by thermal, radiation or mechanical means to separate the wavelength conversion layer from the substrate and the release layer. Example materials for the release layer include, but are not limited to, polymer layers, thin metal layer or inorganic materials that preferentially absorb light.

Figure 1B:
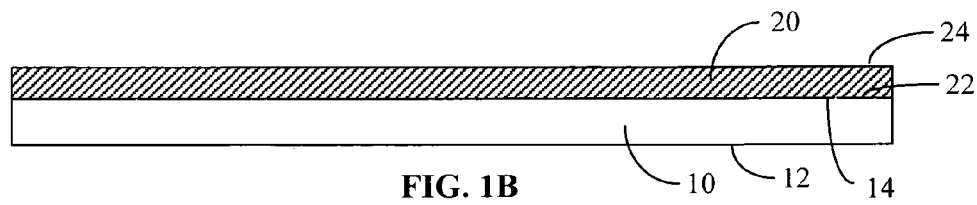

The next process step is to deposit a wavelength conversion layer 20 on the top surface 14 of substrate 10 as illustrated in a side cross-sectional view in FIG. 1B. The wavelength conversion layer 20 has a bottom surface 22 in contact with the top surface 14 of substrate 10 and a top surface 24.

The wavelength conversion layer 20 is formed from wavelength conversion materials. The wavelength conversion materials absorb light in a first wavelength range and emit light in a second wavelength range, where the light of a second wavelength range has longer wavelengths than the light of a first wavelength range. The wavelength conversion materials may be, for example, phosphor materials or quantum dot materials. The phosphor materials may be in the form of powders, ceramics, thin film solids or bulk solids. Preferred forms are ceramics and thin solid films. The wavelength conversion layer may be formed from two or more different wavelength conversion materials. The wavelength conversion layer 20 may also include optically inert host materials for the wavelength conversion materials of phosphors or quantum dots.

Phosphor materials are typically optical inorganic materials doped with ions of lanthanide (rare earth) elements or, alternatively, ions such as chromium, titanium, vanadium, cobalt, manganese or magnesium. The lanthanide elements are lanthanum, cerium, praseodymium, neodymium, promethium, samarium, europium, gadolinium, terbium, dysprosium, holmium, erbium, thulium, ytterbium and lutetium. Optical inorganic materials include, but are not limited to, sapphire ($Al_2O_3$), gallium arsenide (GaAs), beryllium aluminum oxide ($BeAl_2O_4$), magnesium fluoride ($MgF_2$), indium phosphide (InP), gallium phosphide (GaP), yttrium aluminum garnet (YAG or $Y_3Al_5O_{12}$), terbium-containing garnet, yttrium-aluminum-lanthanide oxide compounds, yttrium-aluminum-lanthanide-gallium oxide compounds, yttrium oxide ($Y_2O_3$), calcium or strontium or barium halophosphates $(Ca,Sr,Ba)_5(PO_4)_3(Cl,F)$, the compound $CeMgAl_{11}O_{19}$, lanthanum phosphate ($LaPO_4$), lanthanide pentaborate materials alanthanide)$(Mg,Zn)B_5O_{10}$), the compound $BaMgAl_{10}O_{17}$, the compound $SrGa_2S_4$, the compounds $(Sr,Mg,Ca,Ba)(Ga,Al,In)_2S_4$, the compound SrS, the compound ZnS and nitridosilicate. There are several exemplary phosphors that can be excited at 250 nm or thereabouts. An exemplary red emitting phosphor is $Y_2O_3:Eu^{3+}$. An exemplary yellow emitting phosphor is $YAG:Ce^{3+}$. Exemplary green emitting phosphors include $CeMgAl_{11}O_{19}:Tb^{3+}$, ((lanthanide)$PO_4:Ce^{3+},Tb^{3+}$) and $GdMgB_5O_{10}:Ce^{3+},Tb^{3+}$. Exemplary blue emitting phosphors are $BaMgAl_{10}O_{17}:Eu^{2+}$ and $(Sr,Ba,Ca)_5(PO_4)_3Cl:Eu^{2+}$. For longer wavelength LED excitation in the 400-450 nm wavelength region or thereabouts, exemplary optical inorganic materials include yttrium aluminum garnet (YAG or $Y_3Al_5O_{12}$), terbium-containing garnet, yttrium oxide ($Y_2O_3$), $YVO_4$, $SrGa_2S_4$, $(Sr,Mg,Ca,Ba)(Ga,Al,In)_2S_4$, SrS, and nitridosilicate. Exemplary phosphors for LED excitation in the 400-450 nm wavelength region include $YAG:Ce^{3+}$, $YAG:Ho^{3+}$, $YAG:Pr^{3+}$, $YAG:Tb^{3+}$, $YAG:Cr^{3+}$, $YAG:Cr^{4+}$, $SrGa_2S_4:Eu^{2+}$, $SrGa_2S_4:Ce^{3+}$, $SrS:Eu^{2+}$ and nitridosilicates doped with $Eu^{2+}$. Other phosphor materials not listed here are also within the scope of this invention.

Quantum dot materials are small particles of inorganic semiconductors having particle sizes less than about 30 nanometers. Exemplary quantum dot materials include, but are not limited to, small particles of CdS, CdSe, ZnSe, InAs, GaAs and GaN. Quantum dot materials can absorb light at first wavelength and then emit light at a second wavelength, where the second wavelength is longer than the first wavelength. The wavelength of the emitted light depends on the particle size, the particle surface properties, and the inorganic semiconductor material.

The transparent and optically inert host materials are especially useful to process phosphor powders or to spatially separate quantum dots. Host materials include polymer materials and inorganic materials. The polymer materials include, but are not limited to, acrylates, polystyrene, polycarbonate, fluoroacrylates, chlorofluoroacrylates, perfluoroacrylates, fluorophosphinate polymers, fluorinated polyimides, polytetrafluoroethylene, fluorosilicones, sol-gels, epoxies, thermoplastics, thermosetting plastics and silicones. Fluorinated polymers are especially useful at ultraviolet wavelengths less than 400 nanometers and infrared wavelengths greater than 700 nanometers owing to their low light absorption in those wavelength ranges. Exemplary inorganic materials include, but are not limited to, silicon dioxide, optical glasses and chalcogenide glasses.

When the wavelength conversion layer 20 is formed from phosphor materials, the phosphors can be deposited by a variety of techniques. The techniques include, but are not limited to, chemical vapor deposition (CVD), metal-organic chemical vapor deposition (MOCVD), sputtering, electron beam evaporation, laser deposition, sol-gel deposition, molecular beam epitaxy (MBE), liquid phase epitaxy (LPE), spin coating, doctor blading and tape casting. Preferred techniques include doctor blading, tape casting, CVD, MOCVD and sputtering. When the wavelength conversion layer is formed from quantum dot materials and inert host materials, deposition techniques include spin coating, doctor blading or tape casting, self assembly, lithography, and nanoimprinting.

The thickness of the wavelength conversion layer 20 can range from about 0.1 micron to about 2000 microns or more. Preferred thicknesses range from about 0.1 micron to about 500 microns.

Figure 1C:
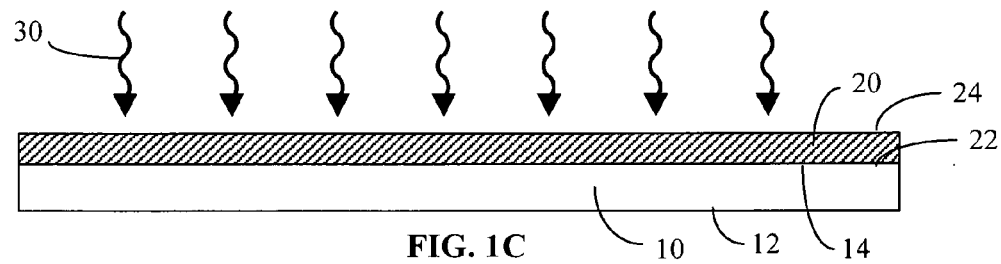

The next process step is an optional annealing step to thermally anneal or radiation anneal the wavelength conversion layer 20 in order to increase the wavelength conversion efficiency of the layer or, in the case of a phosphor powder, to sinter the powder to form a ceramic layer. This step is especially important for thin film phosphors, since as-deposited thin film phosphors may have low wavelength conversion efficiency if the deposited layer is not properly annealed. The annealing step can be any heat treatment or any radiation treatment of the wavelength conversion material in the wavelength conversion layer 20 that anneals the phosphor. Heating the wavelength conversion material in the wavelength conversion layer to, for example, 600 degrees Celsius for one hour can result in thermal annealing of the wavelength conversion material. Appropriate annealing temperatures and times may vary for different wavelength conversion materials. Example radiation annealing treatments include subjecting the wavelength conversion material in the wavelength conversion layer 20 to infrared, visible or ultraviolet light 30 as shown in FIG. 1C or subjecting the wavelength conversion material in the wavelength conversion layer to electron beam, atomic beam or ion beam bombardment. The radiation sources may be pulsed or continuous. The light sources may be incoherent or coherent (e.g. laser) sources.

If the wavelength conversion material is a phosphor powder mixed with an organic binder, the annealing step may be done in two or more steps. For example, a low temperature (less than 300 degrees Celsius) anneal can be done to remove the organic binder material. Following the removal of the organic material, a high temperature (greater than 500 degrees Celsius) anneal can then be done to sinter the phosphor powder into a ceramic solid.

The annealing step is illustrated in FIG. 1C to occur after the deposition of the wavelength conversion layer and before segmentation of the layer. However, the annealing step may also be done later in the process sequence, including after the wavelength conversion layer is removed from the substrate. Doing the annealing step after the wavelength conversion layer is removed from the substrate is necessary if the substrate 10 cannot withstand high temperature or high radiation processing. The annealing step may be done in air, in an inert atmosphere such as nitrogen or argon or in a partial vacuum.

Figure 1D:
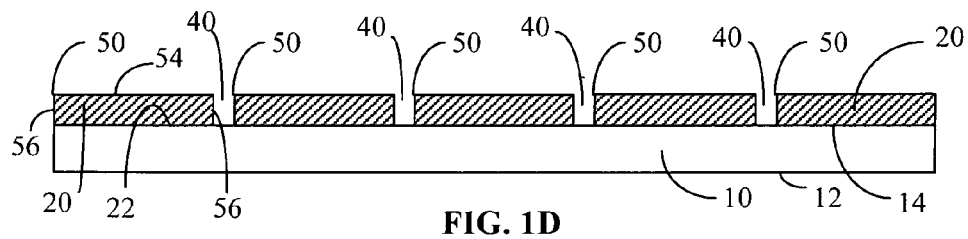

The next process step is to segment the wavelength conversion layer 20 into a plurality of wavelength conversion chips 50. Grooves or streets 40 are formed through the wavelength conversion layer 20 as shown in a side cross-sectional view in FIG. 1D. The streets 40 are fabricated in two directions (only one direction is shown) to form a plurality of wavelength conversion chips 50 that can be square, rectangular or any other planar geometric shape. The plurality of wavelength conversion chips 50 is, at this stage, still attached to the substrate 10. The wavelength conversion chips have a top surface 54 and side surfaces 56. The bottom surface 22 of the wavelength conversion layer 20 is still attached to the top surface 14 of substrate 10. The streets 40 can be formed by techniques that include, but are not limited to, laser scribing, mechanical scribing or optical lithography accompanied by wet chemical etching, sputter etching or ion beam etching.

Figure 1E:
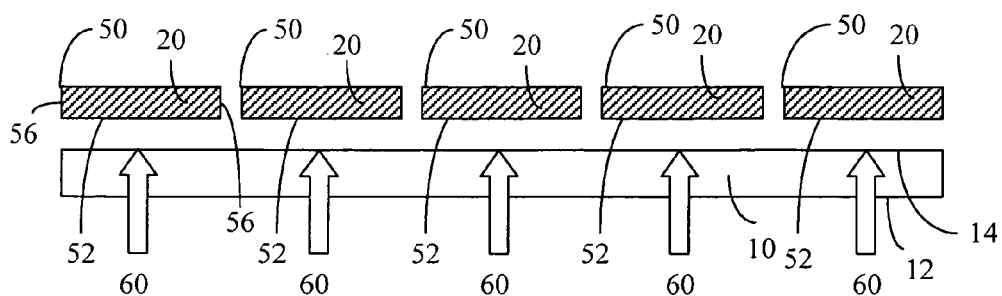

The final step is to remove the plurality of wavelength conversion chips 50 from substrate 10. For example, the plurality of wavelength conversion chips 50 can be removed by directing a pulsed laser beam 60 though substrate 10 to destroy the adhesion of the bottom surface 22 of the wavelength conversion layer 20 to the top surface 14 of the substrate 10 as shown in a side cross-sectional view in FIG. 1E. Other methods of removing the plurality of wavelength conversion chips include thermal, radiation, chemical or mechanical means. If the chips are fabricated on a continuous web, mechanically flexing the web will release the chips. The removal can be facilitated if the top surface 14 of substrate 10 includes a release layer (not shown) that can be degraded by thermal, radiation or chemical means. The detached wavelength conversion chips each have an exposed bottom surface 52.

Figure 1F:
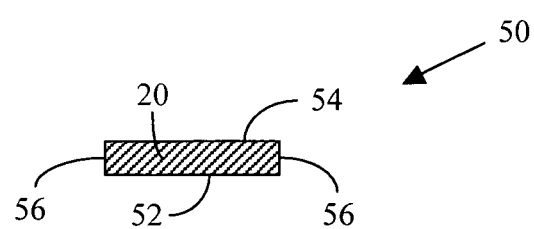
FIG. 1F is a side cross-sectional view and FIG. 1G is a top plan view of a wavelength conversion chip made by the process illustrated in FIGS. 1A-1E.
Figure 1G:
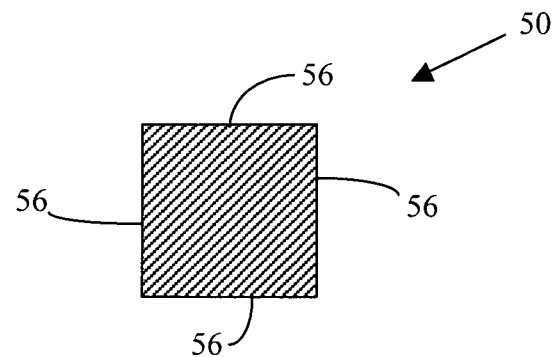

A side cross-sectional view of wavelength conversion chip 50 is illustrated in FIG. 1F. A top plan view of wavelength conversion chip 50 is shown in FIG. 1G. The wavelength conversion chip 50 has a bottom surface 52, a top surface 54 and side surfaces 56.

Another embodiment of this invention is a process shown in FIGS. 2A-2G for forming wavelength conversion chips that optionally include an optical coating on the top surface of the chips. Examples of optical coatings include a dichroic mirror coating that transmits light of a first wavelength range and reflects light of a second wavelength range, an antireflection coating, a reflecting polarizer coating or a photonic bandgap coating. The elements with the same numerical reference in FIG. 2 as in FIG. 1 are the same elements as in FIG. 1 and have the same properties as the elements in FIG. 1. Some of the steps of the process shown in FIGS. 2A-2G are identical to the process steps outlined above in FIGS. 1A-1G. The process can be either a batch process or a continuous web process. The resulting wavelength conversion chips are substantially planar in order to facilitate bonding to the LEDs. The length and width dimensions of the wavelength conversion chips can be greater than, equal to or smaller than the length and width dimensions of the LEDs onto which the chips will be attached.

Figure 2A:
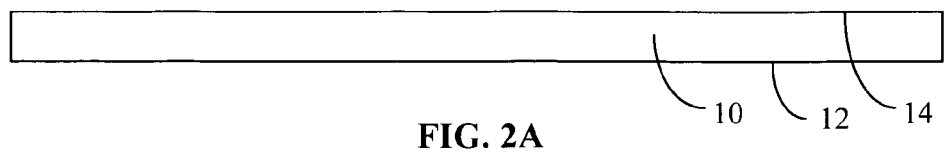
FIGS. 2A-2E are side cross-sectional views illustrating process steps needed to fabricate a wavelength conversion chip that includes an optical coating on one surface.

The first step in the process for forming wavelength conversion chips that include an optical coating is to select a substrate 10, which is shown in a side cross-sectional view in FIG. 2A. Substrate 10 has a bottom surface 12 and a top surface 14 opposite bottom surface 12. Substrate 10 can be a polymeric material, a metal layer or an inorganic material. Example substrate materials are described above for FIG. 1. Optionally, the top surface 14 of substrate 10 may include a release layer (not shown) to facilitate the removal of any subsequently deposited materials. The release layer may be activated by thermal, radiation or mechanical means. Example release layer materials are described above for FIG. 1.

Figure 2B:
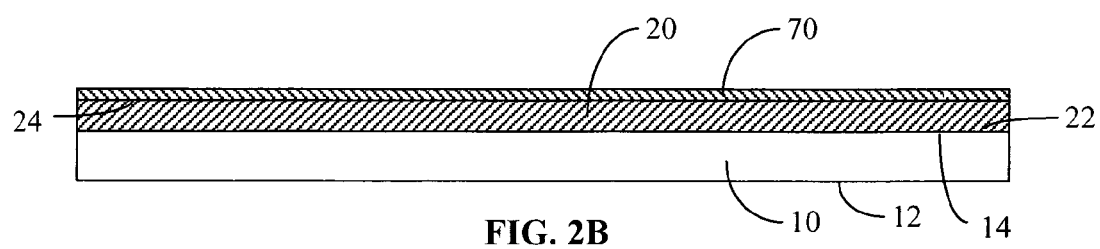

The next process step is to deposit a wavelength conversion layer 20 on the top surface 14 of substrate 10 as illustrated in a side cross-sectional view in FIG. 2B. The wavelength conversion layer 20 has a bottom surface 22 in contact with the top surface 14 of substrate 10 and a top surface 24.

The wavelength conversion layer 20 is formed from one or more wavelength conversion materials. The wavelength conversion materials may be, for example, phosphor materials or quantum dot materials or a plurality of such materials. The wavelength conversion layer 20 may also include optically inert host materials in addition to the phosphors or quantum dots. Examples of phosphor materials, quantum dot materials and inert host materials are described above for FIGS. 1A-1G. Deposition methods are also described above for FIG. 1.

An optical coating 70 is deposited on the top surface 24 of the wavelength conversion layer 20. The optical coating can be deposited immediately following the deposition of the wavelength conversion layer 20 as shown in the side cross-sectional view in FIG. 2B. However, it is within the scope of this invention that the optical coating may be deposited later in the overall process. For example, the optical coating may be deposited after the wavelength conversion layer is segmented into wavelength conversion chips. Example optical coatings include reflective coating layers that are wavelength dependent or polarization dependent, photonic bandgap coatings and single or multilayered antireflection coatings on the surface of the wavelength conversion chips that reduce Fresnel reflection effects on one or more surfaces.

An example wavelength dependent reflective optical coating 70 is a dichroic coating that transmits light having a first range of wavelengths and reflects light having a second range of wavelengths. As a first example, a dichroic coating, 70 can be deposited on the surface of a green-emitting wavelength conversion layer 20. The coating 70 can transmit green light and reflect blue or ultraviolet light. This type of coating is useful if the wavelength conversion chip 50 is attached to a blue or ultraviolet LED and the optical coating 70 is on the surface of the chip opposite the LED. In this example, blue or ultraviolet light emitted by the LED that is not absorbed during the first pass through the wavelength conversion layer 20 is reflected back through the wavelength conversion chip to interact with the wavelength conversion layer 20 a second time. This increases the probability that the blue or ultraviolet light will be absorbed by the wavelength conversion layer and re-emitted as green light, resulting in a higher output of green light.

As a second example, a dichroic coating 70 can be deposited on the surface of a green-emitting wavelength conversion layer 20. The coating 70 can reflect green light and transmit blue or ultraviolet light. This type of coating is useful if the wavelength conversion chip 50 is attached to a blue or ultraviolet LED and the optical coating 70 is on the surface of the chip adjacent to the LED. In this example, green light emitted by the wavelength conversion layer toward the LED is reflected by the coating and directed through the output surface of the wavelength conversion chip opposite the LED. This reflection and direction prevents the green light from entering the LED and being partially absorbed by the LED. The result is higher output of green light from the output surface.

As a third example of dichroic coatings, a wavelength conversion chip 50 may have two dichroic coatings deposited on opposite surfaces of the chip. Two dichroic coatings are useful if the wavelength conversion chip 50 is attached to a blue or ultraviolet LED and the first dichroic coating on the surface of the chip adjacent to the LED transmits blue or ultraviolet light and reflects green light and the second dichroic coating on the surface of the chip opposite the LED transmits green light and reflects blue or ultraviolet light. Both coating enhance the amount of green light emitted by the wavelength conversion chip.

Another example of a wavelength dependent reflective optical coating 70 is a reflecting polarizer composed of linear subwavelength optical elements. The optical coating 70 can transmit light that is polarized parallel to the linear subwavelength optical elements and can reflect light that is polarized perpendicular to the linear subwavelength optical elements.

An example of a photonic bandgap optical coating 70 is a photonic bandgap structure that provides directionality to light exiting the wavelength conversion chip. For example, the photonic bandgap optical coating can be a two-dimensional array of closely spaced vertical pillars on the surface of the wavelength conversion chip. The array of pillars can inhibit the transmission of light within the plane of the coating and direct the emitted light preferentially in a direction perpendicular to the plane of the coating.

An example of an antireflection optical coating 70 is a one-quarter wavelength thick layer of a low refractive index material such as magnesium fluoride or silicon dioxide. When the optical coating 70 has a lower refractive index than the wavelength conversion layer 20 and is one-quarter of an optical wavelength thick, the coating can reduce Fresnel reflections from the surface of the wavelength conversion chip.

Figure 2C:
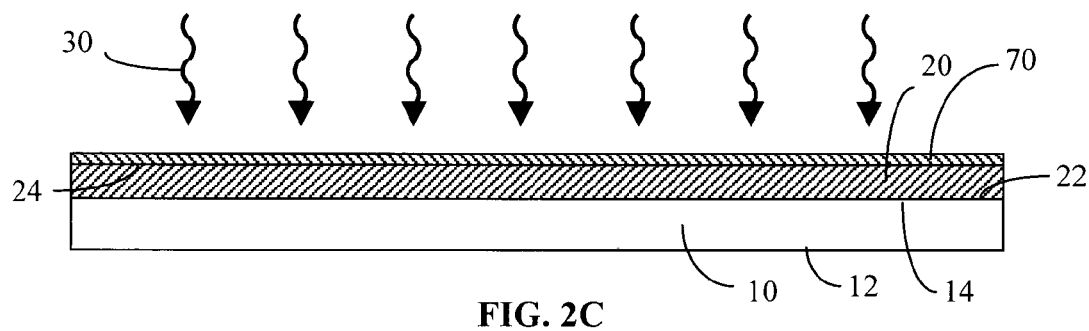
Figure 2D:
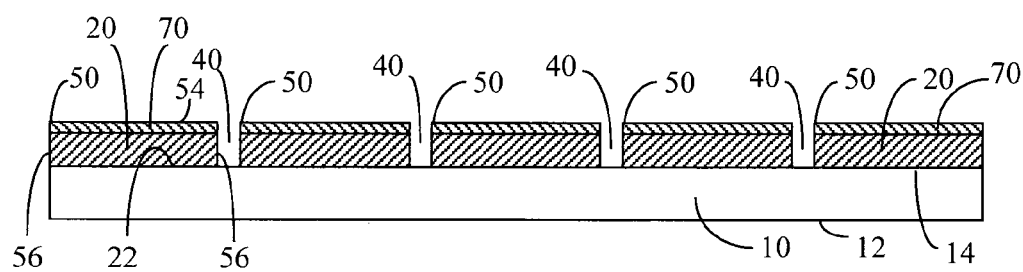
Figure 2E:
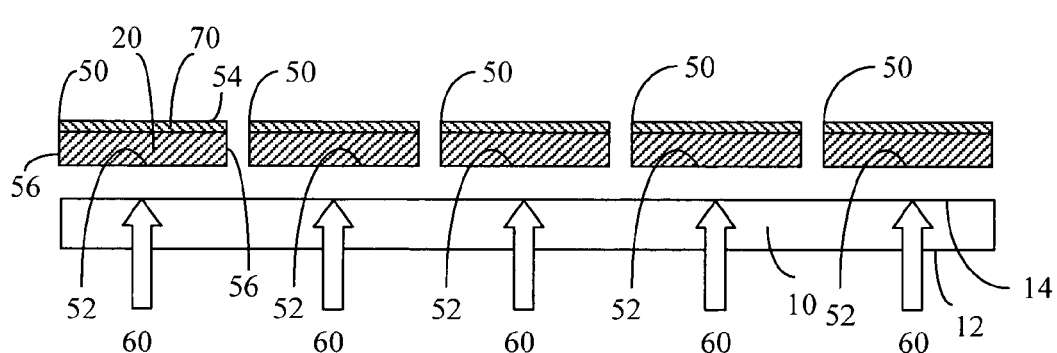

The next process step is an optional annealing step to thermally anneal or radiation anneal the wavelength conversion layer 20 in order to increase the wavelength conversion efficiency of the layer or, in the case of a phosphor powder, to sinter the powder to form a ceramic layer. This step is important for thin film phosphors, since as-deposited thin film phosphors may have low wavelength conversion efficiency if the deposited layers are not properly annealed. The annealing step can be any heat treatment or any radiation treatment of the wavelength conversion material in the wavelength conversion layer 20 that anneals the phosphor. Heating the wavelength conversion material in the wavelength conversion layer to, for example, 600 degrees Celsius for one hour can result in thermal annealing of the wavelength conversion material. Appropriate annealing temperatures and times may vary for different wavelength conversion materials. Example radiation treatments include subjecting the wavelength conversion material in the wavelength conversion layer 20 and the optical coating 70 to infrared, visible or ultraviolet light 30 as shown in FIG. 2C or subjecting the wavelength conversion material in the wavelength conversion layer 20 and the optical coating 70 to electron beam, atomic beam or ion beam bombardment. The radiation sources may be pulsed or continuous. The light sources may be incoherent or coherent (e.g. laser) sources.

As described above for FIG. 1, the annealing step can be done later in the process sequence. For example, the annealing step can be done after the wavelength conversion chips are removed from the substrate 10. In addition, if the wavelength conversion material is a phosphor powder mixed with an organic binder, the annealing step may be done in two or more parts to first remove the organic binder and second to sinter the phosphor powder into a ceramic solid.

The next process step is to segment the wavelength conversion layer 20 and the optical coating 70 into a plurality of wavelength conversion chips 50. Grooves or streets 40 are formed through the optical coating 70 and the wavelength conversion layer 20 as shown in a side cross-sectional view in FIG. 2D. The streets 40 are fabricated in two directions (only one direction is shown) to form a plurality of wavelength conversion chips 50 that can be square, rectangular or any other planar geometric shape. The wavelength conversion chips are, at this stage, still attached to the substrate 10. The wavelength conversion chips have a top surface 54 and side surfaces 56. The bottom surface 22 of the wavelength conversion layer 20 is still attached to the top surface 14 of substrate 10. The streets 40 can be formed by techniques that include, but are not limited to, laser scribing, mechanical scribing or optical lithography accompanied by wet chemical etching, sputter etching or ion beam etching.

The final step is to remove the plurality of wavelength conversion chips 50 from substrate 10. For example, the wavelength conversion chips 50 can be removed by directing a pulsed laser beam 60 though substrate 10 to destroy the adhesion of the chips to the substrate as shown in a side cross-sectional view in FIG. 2E. Other methods of removing the wavelength conversion chips include thermal, radiation, chemical or mechanical means. The removal can be facilitated if the top surface 14 of substrate 10 includes a release layer (not shown) that can be degraded by thermal, radiation or chemical means.

Figure 2F:
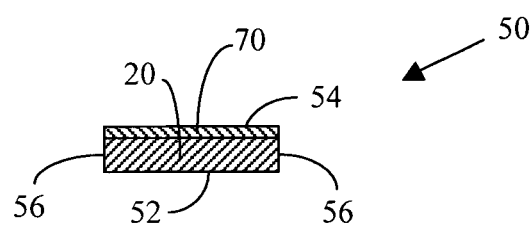
FIG. 2F is a side cross-sectional view and FIG. 2G is a top plan view of a wavelength conversion chip that includes an optical coating and that is made by the process illustrated in FIGS. 2A-2E.
Figure 2G:
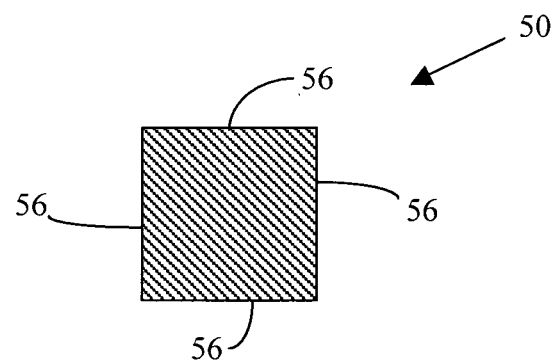

A side cross-sectional view of wavelength conversion chip 50 is illustrated in FIG. 2F. A top plan view of wavelength conversion chip 50 is shown in FIG. 2G. The wavelength conversion chip 50 has a bottom surface 52, a top surface 54 and side surfaces 56.

Another embodiment of this invention is a process shown in FIGS. 3A-3H for forming wavelength conversion chips that optionally include vias that extend through the wavelength conversion chip or that optionally include arrays of light extracting elements. The elements with the same numerical reference in FIG. 3 as in FIG. 1 are the same elements as in FIG. 1 and have the same properties as the elements in FIG. 1. Some of the steps of the process shown in FIGS. 3A-3H are identical to the process steps outlined in FIGS. 1A-1G. As in the previously disclosed processes, the process that optionally includes vias or light extracting elements can be either a batch process or a continuous web process.

Figure 3A:
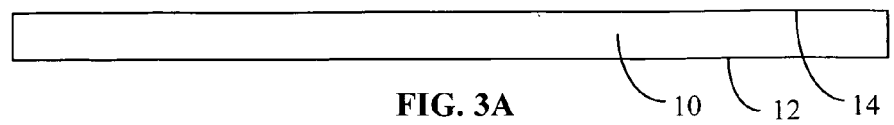
Figure 3B:
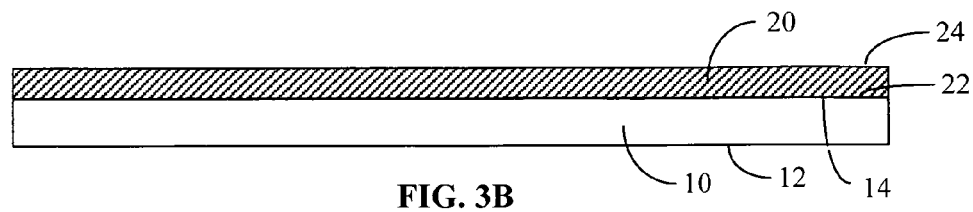

The first step in the process for forming wavelength conversion chips is to select a substrate 10, which is shown in a side cross-sectional view in FIG. 3A. Substrate 10 has a bottom surface 12 and a top surface 14 opposite bottom surface 12. Substrate 10 can be a polymeric material, a metal layer or an inorganic material. Example substrate materials are described previously. Optionally, the top surface 14 of substrate 10 may include a release layer (not shown) to facilitate the removal of any subsequently deposited materials. The release layer may be activated by thermal, radiation or mechanical means. Example release layer materials are described previously.

The next process step is to deposit a wavelength conversion layer 20 on the top surface 14 of substrate 10 as illustrated in a side cross-sectional view in FIG. 2B. The wavelength conversion layer 20 has a bottom surface 22 in contact with the top surface 14 of substrate 10 and a top surface 24.

The wavelength conversion layer 20 is formed from one or more wavelength conversion materials. The wavelength conversion materials may be, for example, phosphor materials or quantum dot materials or a plurality of such materials. The wavelength conversion layer 20 may also include optically inert host materials in addition to the phosphors or quantum dots. Examples of phosphor materials, quantum dot materials and inert host materials are described above for FIGS. 1A-1G. Deposition methods are also listed previously.

Figure 3C:
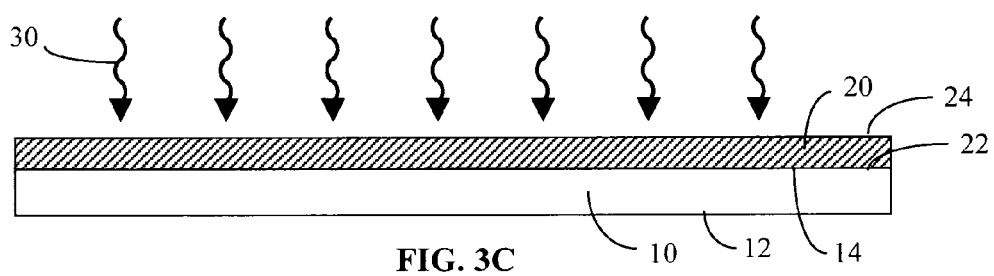
Figure 3D:
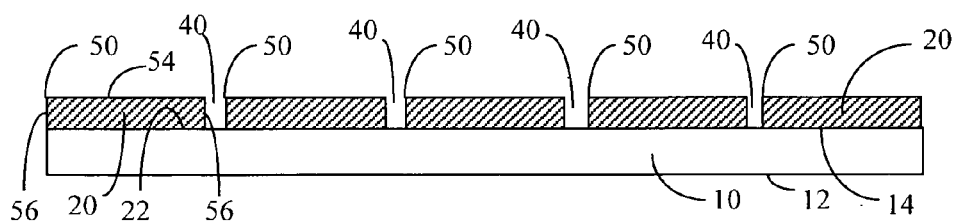

The next process step is an optional annealing step illustrated in FIG. 3C to thermal anneal or radiation anneal the wavelength conversion material. Details of the annealing step are described above for FIGS. 1 and 2.

The next process step is to segment the wavelength conversion layer 20 into a plurality of wavelength conversion chips 50. Grooves or streets 40 are formed through the wavelength conversion layer 20 as shown in a side cross-sectional view in FIG. 3D. The streets 40 are fabricated in two directions (only one direction is shown) to form a plurality of wavelength conversion chips 50 that can be square, rectangular or any other planar geometric shape. The wavelength conversion chips 50 are, at this stage, still attached to the substrate 10. The wavelength conversion chips have a top surface 54 and side surfaces 56. The bottom surface 22 of the wavelength conversion layer 20 is still attached to the top surface 14 of substrate 10. The streets 40 can be formed by techniques that include, but are not limited to, laser scribing, mechanical scribing or optical lithography accompanied by wet chemical etching, sputter etching or ion beam etching.

The next step is to form one or more vias and/or one or more light extracting elements in the wavelength conversion chips 50. Via 82 is illustrated in FIGS. 3E-3H. Via 82 is interior to the edges 56 of the wavelength conversion chip 50 and passes through the wavelength conversion chip 50 from side 52 to side 54 as shown in FIGS. 3F and 3G. Vias are required if one wishes to form electrical pathways through the chip. The vias may be air-filled vias or the vias may be filled with an electrically conducting material (not shown) such as a metal.

Light extracting elements 80 are elements that aid in the removal of light from the wavelength conversion chip 50. In general, the refractive index of the wavelength conversion layer 20 is higher than the refractive index of air. A portion of the light that is emitted by the wavelength conversion material can be trapped inside the wavelength conversion chip 50 by total internal reflection. Light extracting elements 80 cause a larger portion of the emitted light to exit the chip. Examples of light extracting elements 80 include, but are not limited to, vertical holes, conical-shaped holes, holes with polygonal cross-sections, conical-shaped bumps, hemispherical-shaped bumps, bumps with polygonal cross-sections such as pyramids, grooves, ridges and subwavelength optical elements. Other examples of light extracting elements are arrays of subwavelength optical elements such as holes or grooves that are arranged to form photonic crystals. For illustrative purposes, the light extracting elements shown in FIGS. 3E-3H are conical-shaped holes.

The light extracting elements 80 may be formed on the top surface 54 of the wavelength conversion chip 50 and may extend either part way or all the way through the chip. If the light extracting elements are subwavelength optical elements, the light extracting elements may be positioned either on the top surface 54 of the chip or may be fabricated inside the chip.

Vias 82 and light extracting elements 80 may be formed by techniques that include, but are not limited to, laser ablation, mechanical etching or by optical lithography accompanied by wet chemical etching, sputter etching or ion beam etching.

Figure 3E:
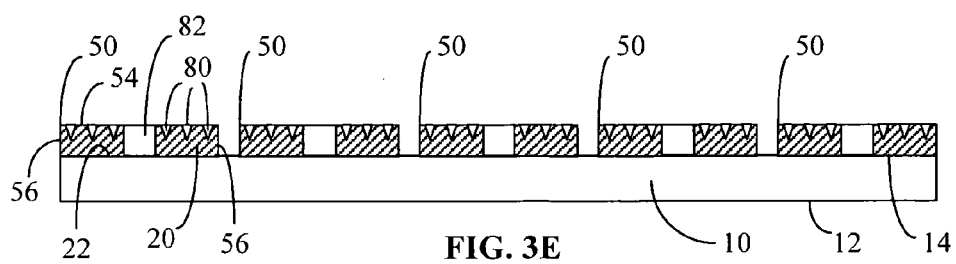
Figure 3G:
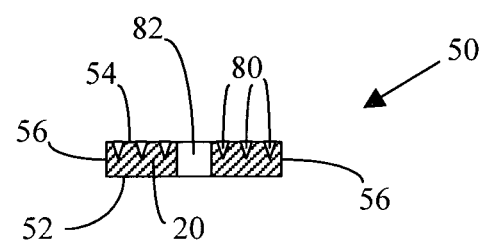
FIG. 3G is a side cross-sectional view and FIG. 3H is a top plan view of a wavelength conversion chip that includes light extracting elements and a through via and that is made by the process illustrated in FIGS. 3A-3F.

Vias 82 and light extracting elements 80 are shown in FIG. 3E to be fabricated in a process step that occurs after the segmentation of the wavelength conversion layer 20 into wavelength conversion chips. However, it is within the scope of this invention that the fabrication of vias and light extracting elements may occur before or at the same time as the segmentation of the wavelength conversion layer.

The final step is to remove the plurality of wavelength conversion chips 50 from substrate 10. For example, the wavelength conversion chips 50 can be removed by directing a pulsed laser beam 60 though substrate 10 to destroy the adhesion of the chips to the substrate as shown in a side cross-sectional view in FIG. 3F. Other methods of removing the wavelength conversion chips include thermal, radiation, chemical or mechanical means. The removal can be facilitated if the top surface 14 of substrate 10 includes a release layer (not shown) that can be degraded by thermal, radiation or chemical means.

Figure 3H:
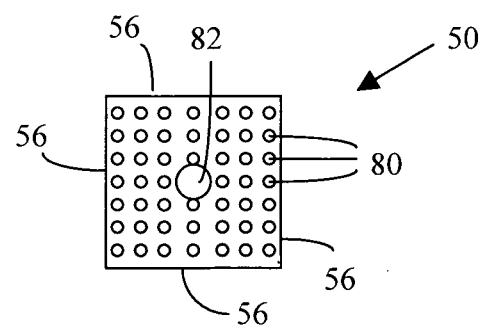

A side cross-sectional view of wavelength conversion chip 50 is illustrated in FIG. 3G. A top plan view of wavelength conversion chip 50 is shown in FIG. 3H. The wavelength conversion chip 50 has a bottom surface 52, a top surface 54, side surfaces 56, light extraction elements 80 and via 82.

Figure 4A:
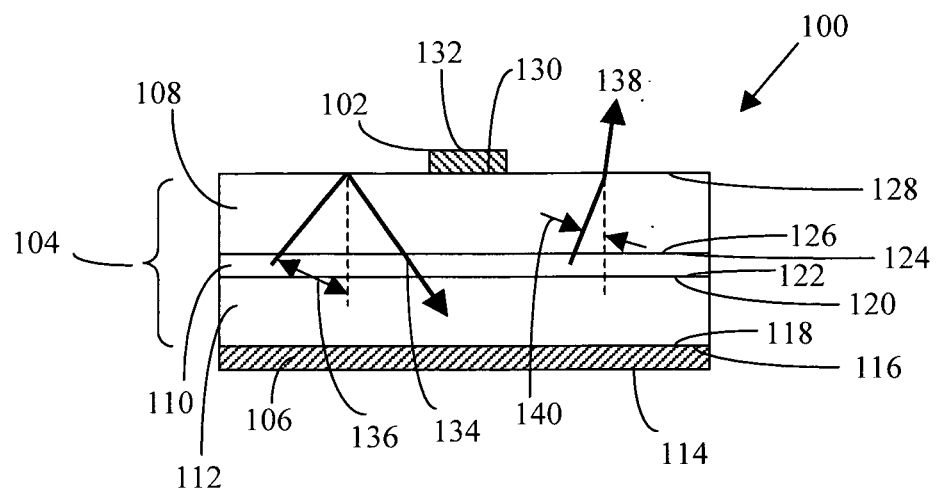
FIGS. 4A and 4B illustrate side cross-sectional views of example light emitting diodes that can be used with this invention.
Figure 4B:
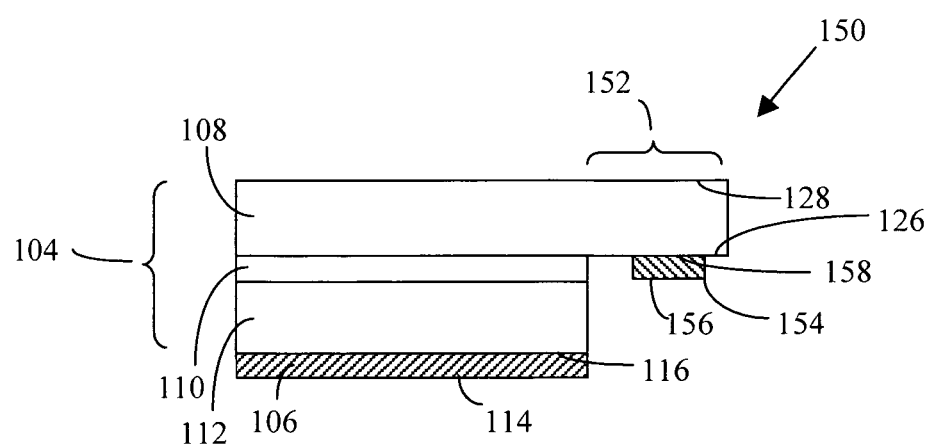

As stated previously, wavelength conversion chips 50 can be used in conjunction with light emitting diodes to form solid-state light sources. Two examples of suitable light emitting diode structures are illustrated in FIGS. 4A and 4B. Other types of light emitting diode structures can also be used with this invention.

Light emitting diodes can be constructed from inorganic or organic materials. Inorganic light-emitting diodes can be fabricated from GaN-based semiconductor materials containing gallium nitride (GaN), aluminum gallium nitride (AlGaN), indium gallium nitride (InGaN) and aluminum indium gallium nitride (AlInGaN). Other appropriate LED materials include, for example, aluminum nitride (AlN), indium nitride (InN), aluminum gallium indium phosphide (AlGaInP), gallium arsenide (GaAs), indium gallium arsenide (InGaAs), indium gallium arsenide phosphide (InGaAsP), diamond or zinc oxide (ZnO), for example, but are not limited to such materials. Especially important LEDs for this invention are inorganic GaN-based LEDs or ZnO-based LEDs that emit light in the ultraviolet and blue regions of the optical spectrum.

FIG. 4A is a side cross sectional view of example LED 100. LED 100 includes a first reflecting electrode 102, a multi-layer semiconductor structure 104 and a second reflecting electrode 106, which is on the opposite side of the multi-layer semiconductor structure 104 from the first reflecting electrode 102. The multi-layer semiconductor structure 104 includes a first doped semiconductor layer 108, an active region 110 and a second doped semiconductor layer 112, which is on the opposite side of the active region 110 from the first doped semiconductor layer 108.

The first reflecting electrode 102 and the second reflecting electrode 106 may be fabricated from reflecting metals. For example, the first reflecting electrode 102 and the second reflecting electrode 106 may be formed from one or more metals or metal alloys containing, but not limited to, silver, aluminum, nickel, titanium, chromium, platinum, palladium, rhodium, rhenium, ruthenium and tungsten. Preferred metals are aluminum and silver.

The first reflecting electrode 102 and the second reflecting electrode 106 may also optionally include a thin layer (not shown) of a transparent material in addition to the metal layer. The optional transparent layer is located between the metal layer and the multilayer semiconductor structure 104. Having a two-layer reflecting electrode increases the reflectivity of the reflecting electrode compared to a single-layer reflecting electrode. Increasing the reflectivity of the reflecting electrode increases the light extraction of LED 100 and the overall external quantum efficiency of LED 100. Preferably the refractive index of the optional transparent layer is less than the refractive index of the semiconductor materials. The preferred refractive index of the optional transparent layer is between 1.05 and 2.3. The thickness of the optional transparent layer can be one-quarter wave or thicker than one-quarter wave. A thickness of one wave is defined as the wavelength in air of the light emitted by the LED divided by the refractive index of the transparent layer. The preferred thickness of the transparent layer is one-quarter wave or three-quarter wave. The optional transparent layer can be fabricated, for example, from dielectric materials such as silicon dioxide ($SiO_2$), silicon nitride ($Si_3N_4$), magnesium fluoride ($MgF_2$) or from electrically conducting materials such as transparent conductive oxides. Transparent conductive oxides include, but are not limited to, indium tin oxide, ruthenium oxide, copper-doped indium oxide and aluminum-doped zinc oxide.

The multi-layer semiconductor structure 104 of the LED 100 is fabricated, for example, from nitride-based semiconductor materials containing gallium nitride (GaN), aluminum gallium nitride (AlGaN), indium gallium nitride (InGaN), aluminum indium gallium nitride (AlInGaN), aluminum nitride (AlN) or indium nitride (InN) or alternatively from ZnO-based semiconductor materials.

The active region 110 of the multi-layer semiconductor structure 104 is a p-n homojunction, a p-n heterojunction, a single quantum well or a multiple quantum well of the appropriate semiconductor material for the LED 100.

LED 100 is assumed for purposes of illustration to be a GaN-based LED. GaN-based LEDs can include the materials GaN, AlGaN, InGaN and AlInGaN. It should be noted, however, that LED 100 may be fabricated from any suitable light-emitting semiconductor material such as the materials listed. To briefly summarize the important fabrication steps for this GaN-based, illustrative example, first a multi-layer semiconductor structure 104 is fabricated on a growth substrate (not shown). A second reflecting electrode 106 is deposited onto the multi-layer semiconductor structure opposite the growth substrate, followed by the attachment of a sub-mount (not shown) to the second reflecting electrode. The structure is inverted (flipped) and a liftoff process removes the growth substrate, exposing the surface 128 of the multi-layer semiconductor structure that was originally attached to the growth substrate. Finally, a first reflecting electrode 102 is deposited and patterned on the exposed surface 128 of the multi-layer semiconductor structure 104 opposite the second reflecting electrode 106.

The details of the structure and fabrication of the illustrative example LED 100 will now be described.

The first doped semiconductor layer 108 is an n-doped GaN layer, which is epitaxially deposited or otherwise conventionally fabricated on a growth substrate (not shown). The n-doped GaN semiconductor layer has a first or upper surface 128 and a second or lower surface 126, opposite the first surface 128.

The active region 110 is a GaN-based p-n heterojunction, which is epitaxially deposited or otherwise conventionally fabricated on the first doped semiconductor layer 108. As an illustrative example, the GaN-based p-n heterojunction can be a GaN/AlGaN heterojunction. The GaN-based p-n heterojunction active region 110 has a first or upper surface 124, deposited or fabricated on the second surface 126 of the first doped semiconductor layer 108, and a second or lower surface 122, opposite the first surface 124.

The second doped semiconductor layer 112 is a p-doped GaN layer, which is epitaxially deposited or otherwise conventionally fabricated on the active region 110. The p-doped GaN semiconductor layer has a first or upper surface 120, epitaxially deposited or otherwise fabricated on the second surface 122 of the active region 110, and a second or lower surface 118, opposite the first surface 120.

The second reflecting electrode 106 of LED 100 is silver, which is deposited or otherwise conventionally fabricated on the lower surface 118 of the second doped semiconductor layer 112. The second reflecting electrode has a first, upper and inner surface 116 and a second, lower or outer surface 114, opposite the first surface 116.

The first reflecting electrode 102 is aluminum, which is deposited or otherwise conventionally fabricated on the first doped semiconductor layer 108. The first reflecting electrode 102 has a first, inner or lower surface 130, deposited or fabricated on the first surface 128 of the first doped semiconductor layer 108, and a second, outer or upper surface 132, opposite the first surface 130.

The inner surface 130 of the first reflecting electrode 102 is an inner reflecting surface for the multi-layer semiconductor structure 104 of the LED 100. The outer surface 132 of the first reflecting electrode 102 is an outer reflecting surface for externally incident light directed to LED 100.

The first reflecting electrode 102 only partially covers the surface 128 of the first doped semiconductor layer 108. Portions of the surface 128 of the first doped semiconductor layer 108, not covered by the first reflecting electrode 102, are exposed and those exposed portions of the surface 128 of the first doped semiconductor layer 108 are an output or exit surface for the light emitted by the LED 100. The portion of the surface 128 not covered by the first reflecting electrode 102 may be covered with light extracting elements (not shown) to improve light extraction from LED 100.

The light emitting diode 100 has a first reflecting electrode 102, a multi-layer semiconductor structure 104 having a first doped semiconductor layer 108, an active region 110 and a second doped semiconductor layer 112, and a second reflecting electrode 106.

The active region 110 emits internally generated light in a wavelength range when a voltage is applied across the first reflecting electrode 102 and the second reflecting electrode 106. The emitting wavelength range of the internally generated light can include any optical wavelength. For an LED having a p-n heterojunction active region 110, the emitting wavelength range typically has a full width of approximately 50 nm at the half-maximum points of the wavelength range. For wavelength conversion applications, preferably the emitting wavelength range is between about 250 nm and about 500 nm.

The total thickness of the multi-layer semiconductor structure 104 is usually on the order of a few microns. For example, the total thickness of the multi-layer semiconductor structure 104 can be two to five microns.

Example light rays 134 and 138 illustrate internally generated light that is emitted by the active region 110. Internally generated light ray 134 is emitted by active region 110 toward output surface 128 of LED 100. Internally generated light ray 134 is directed at an angle 136 that is greater than the critical angle for output surface 128. Internally generated light ray 134 is reflected by total internal reflection and is redirected toward internal reflective surface 116 of the second reflecting electrode 106.

Internally generated light ray 138 is emitted by active region 110 toward outer surface 128 of the first semiconductor layer 108 of LED 100. Internally generated light ray 138 is directed at an angle 140 that is less than the critical angle for outer surface 128. Internally generated light ray 138 is transmitted through outer surface 128.

In the illustrative example LED 100, the first doped semiconductor layer 108 is a n-doped layer and the second doped semiconductor layer 112 is a p-doped layer. However, the two layers can be reversed. If the first doped semiconductor layer 108 is a p-doped layer, then the second doped semiconductor layer 112 is an n-doped layer. The two doped semiconductor layers 108 and 112 will have opposite n and p conductivity types.

It is well known by those skilled in the art that the multi-layer semiconductor structure 104 may include additional layers in order to adjust and improve the operation of the LED 100. For example, a current spreading layer may be inserted between surface 130 of the first reflecting electrode 102 and surface 128 the first doped semiconductor layer 108. Such a current spreading layer will have the same conductivity type as the first doped semiconductor layer and will improve the uniformity of current injection across the entire active region. In addition, a current spreading layer may be inserted between surface 118 of the second doped semiconductor layer and surface 116 of the second reflecting electrode 106. The latter current spreading layer will have the same conductivity type as the second doped semiconductor layer. As another example, an electron blocking layer may inserted either between surface 126 of the first doped semiconductor layer 108 and surface 124 of the active region 110 or between surface 122 of the active region 110 and surface 120 of the second doped semiconductor layer. The electron blocking layer reduces the escape of electrons from the active region.

FIG. 4B is a cross sectional view of another example light emitting diode, LED 150. LED 150 is similar to LED 100 except that LED 150 is constructed in a flip-chip configuration with both the first reflecting electrode 154 and the second reflecting electrode 106 located on the same side of the LED 150. In this embodiment, the first doped semiconductor layer 108 has a larger surface area than the active region 110 and the second doped semiconductor layer 112. A portion 152 of the first doped semiconductor layer 108 will extend away from the active region 110 and the second doped semiconductor layer 112 exposing a portion 152 of the second surface 126 of the first doped semiconductor layer 108. The first reflecting electrode 154 is located on the exposed second or inner surface 126 of the first doped semiconductor layer 108 adjacent to the action region 110 instead of the first or outer surface 128 of the first doped semiconductor layer 108. The first reflecting electrode 154 has a first or upper surface 158 and a second or lower surface 156, opposite the first surface 158. The first surface 158 of the first reflecting electrode 154 is deposited or fabricated on the exposed second surface 126 of the first doped semiconductor layer 108.

The first reflecting electrode 154 is in electrical contact with the first doped semiconductor layer 108. The first doped semiconductor layer 108 functions as a current spreading layer that directs electrical current from the first reflecting electrode 154 to the active region 110.

The first surface 128 of the first doped semiconductor layer 108 has no reflecting electrode on its surface. Light emitted by the active region 110 can exit across the entire area of the first surface 128 of the first doped semiconductor layer 108. The entire surface functions as an output surface. The surface 128 may also include optional light extracting elements (not shown) to improve light extraction from LED 150. The first reflecting electrode 154, now on the lower side of LED 150, can reflect both internally generated light and externally incident light.

Solid-state light sources can be constructed by combining an LED with one or more wavelength conversion chips. Some illustrative examples are shown in FIGS. 5-9. FIGS. 5-7 illustrate solid-state light sources that have one or more wavelength conversion chips that include one or more vias and one or more light extracting elements. The LEDs in FIGS. 5-7 each have a top first reflecting electrode. Vias through the wavelength conversion chips are required in order to make electrical contacts with the first reflecting electrodes. FIG. 8A-8C illustrate solid-state light sources that have one or more wavelength conversion chips that include light extracting elements, but no vias. The LEDs in FIGS. 8A-8C each have first reflecting electrodes on the second or bottom surface of the first semiconductor layer 108. FIG. 9 illustrates a solid-state light source that has a wavelength conversion chip that includes an optical coating on the top surface of the chip. In the latter example, the wavelength conversion chip does not include a via or a light extracting element.

Figure 5A:
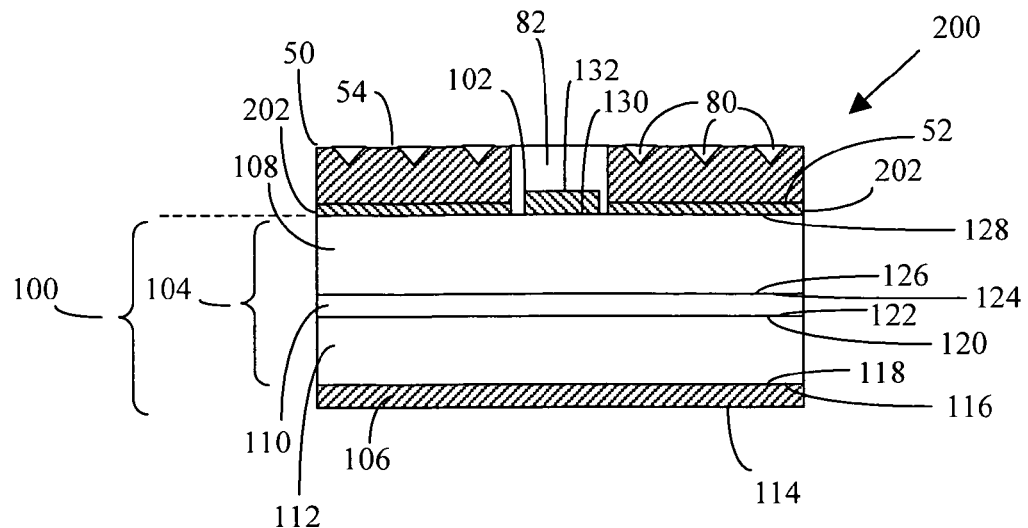
FIG. 5A is a side cross-sectional view of a solid-state light source that includes one wavelength conversion chip.

Another embodiment of this invention is solid-state light source 200 shown in a side cross-sectional view in FIG. 5A. Solid-state light source 200 includes LED 100, which has a top first reflecting electrode 102, wavelength conversion chip 50 and a bonding layer 202. The wavelength conversion chip 50 includes light extracting elements 80 and via 82 that extends through the chip.

The LED 100 of the solid-state light source 200 emits light in a first wavelength range. The wavelength conversion chip 50 converts light of a first wavelength range into light of a second wavelength range, different than the first wavelength range. The light of a second wavelength range has longer wavelengths than the light of a first wavelength range.

In FIG. 5A, the wavelength conversion chip covers the entire surface 128 of LED 100 except for the area occupied by via 82. It is also within the scope of this invention that the wavelength conversion chip 50 may have an area that is larger or smaller than the area of the top surface 128 of LED 100.

The wavelength conversion chip is attached to LED 100 by a transparent and thermally conducting bonding layer 202. Preferably the refractive index of bonding layer 202 is 1.30 or higher. The high refractive index of the bonding layer frustrates total internal reflection and improves the extraction of photons normally trapped within the LED die. The bonding layer also provides a thermal conduction path from the wavelength conversion chip 50 to LED 100. Heat generated inside the wavelength conversion chip 50 can pass through the bonding layer 202 and through LED 100 to a heat sink (not shown) attached to the bottom surface 114 of the LED.

Example materials for bonding layer 202 include low melting point transparent conducting oxides (TCOs), low melting point inorganic glasses and polymers. Example transparent conducting oxides include tin oxide, indium oxide, gallium oxide, indium tin oxide, ruthenium oxide, copper-doped indium oxide and aluminum-doped zinc oxide. Low melting point inorganic glasses include alkali glasses. Polymer materials include epoxies, acrylates, sol-gels, silicones, chlorinated or fluorinated polymers and xerogels. An example fluorinated polymer is tetrafluoroethylene.

If bonding layer 202 is a TCO or inorganic glass, sputtering, electron beam evaporation, chemical vapor deposition or metal-organic chemical vapor deposition can be used to deposit the bonding layer. If bonding layer 202 is a polymer, spin coating or spray coating can be used to deposit the bonding layer.

Figure 5B:
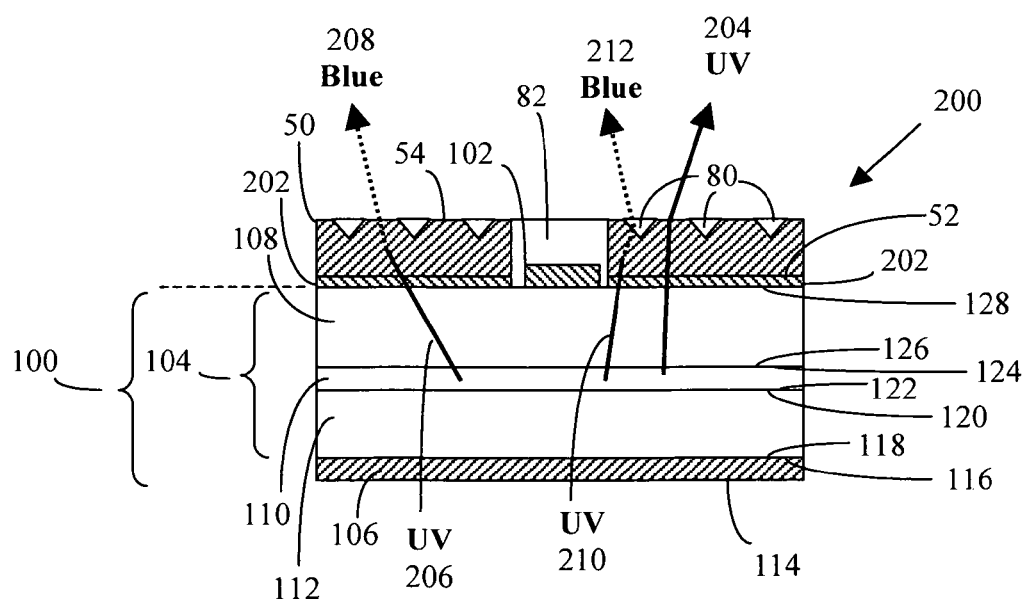
FIG. 5B is a side cross-sectional view showing example light rays emitted by the solid-state light source illustrated in FIG. 5A.

Example light rays 204, 206, 208, 210 and 212 in FIG. 5B illustrate the operation of solid-state light source 200. When an electrical current is applied through LED 100 via the first reflecting electrode 102 and the second reflecting electrode 106, the active region 110 emits internally generated light. The wavelength of the internally generated light can be any optical wavelength. Preferably the wavelength of the internally generated light is in the wavelength range from about 250 nm to about 500 nm. For wavelength conversion applications, usually the wavelength of the internally generated light is in the ultraviolet (UV) or blue regions of the optical spectrum. For illustrative purposes only, LED 100 is shown to emit UV light. For example, LED 100 can emit 360 nm UV light.

Internally generated UV light ray 204 is emitted by active region 110 of LED 100. UV light ray 204 is transmitted through the first doped semiconductor layer 108, through top surface 128 of LED 100, through bonding layer 202 and through the wavelength conversion chip 50 without being converted. UV light ray 204 exits solid-state light source 200 through surface 54 of the wavelength conversion chip 50.

Internally generated UV light ray 206 is emitted by active region 110 of LED 100. UV light ray 206 is transmitted through the first doped semiconductor layer 108, through top surface 128 of LED 100, through bonding layer 202 and into the wavelength conversion chip 50. Wavelength conversion chip 50 converts UV light ray 206 into blue light ray 208. The conversion of UV light ray 206 to blue light is an illustrative example. Depending on the composition of the wavelength conversion layer, the UV light could be converted instead into, for example, cyan, green, yellow, red or infrared light. Blue light ray 208 passes through the remainder of the wavelength conversion chip 50 and exits solid-state light source 200 through surface 54 of the wavelength conversion chip.

Internally generated UV light ray 210 is emitted by active region 110 of LED 100. UV light ray 210 is transmitted through the first doped semiconductor layer 108, through top surface 128 of LED 100, through bonding layer 202 and into the wavelength conversion chip 50. Wavelength conversion chip 50 converts UV light ray 210 into blue light ray 212. Blue light ray 212 passes through the remainder of the wavelength conversion chip 50, is extracted from the wavelength conversion chip by light extracting element 80 and exits the solid-state light source 200. Light extraction element 80 improves the light extraction efficiency of wavelength conversion chip 50 by reducing the probability of total internal reflection of light ray 212 at the top surface 54 of the wavelength conversion chip.

The wavelength conversion chip 50 converts UV light rays 206 and 210 into blue light. Light ray 204 passes through wavelength conversion chip 50 without conversion. Only a portion of the UV light emitted by the active region of the LED that passes through the wavelength conversion chip is converted into blue light.

Figure 6A:
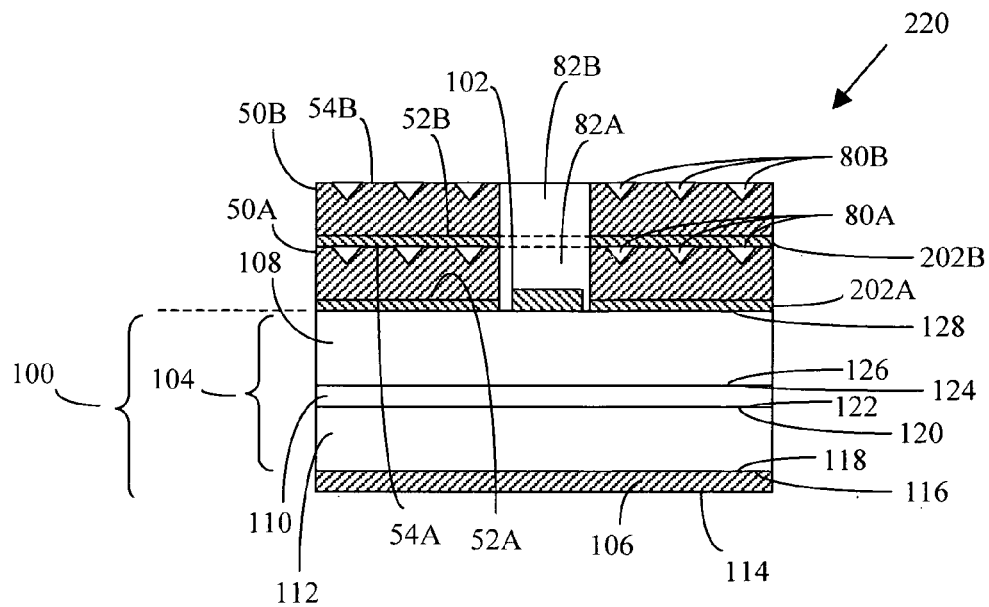
FIG. 6A is a side cross-sectional view of a solid-state light source that includes two wavelength conversion chips.

Another embodiment of this invention is solid-state light source 220 shown in a side cross-sectional view in FIG. 6A. Solid-state light source 220 includes LED 100, which has a top first reflecting electrode 102, two wavelength conversion chips 50A and 50B and two bonding layers 202A and 202B. The wavelength conversion chip 50A includes light extracting elements 80A and via 82A that extends through the chip. The wavelength conversion chip 50B includes light extracting elements 80B and via 82B that extends through the chip.

LED 100 of solid-state light source 220 emits light in a first wavelength range. Wavelength conversion chip 50A converts light of a first wavelength range into light of a second wavelength range, different than the first wavelength range. The light of a second wavelength range has longer wavelengths than the light of a first wavelength range. Wavelength conversion chip 50B converts light of a first wavelength range into light of a third wavelength range, different than the first wavelength range and the second wavelength range. The light of a third wavelength range has a longer wavelength than the light of a first wavelength range.

In FIG. 6A, the wavelength conversion chips 50A and 50B cover the entire surface 128 of LED 100 except for the area occupied by vias 82A and 82B. It is also within the scope of this invention that the wavelength conversion chips 50A and 50B may have an area that is larger or smaller than the area of the top surface 128 of LED 100.

The wavelength conversion chips are attached to LED 100 by transparent and thermally conducting bonding layers 202A and 202B. Preferably the refractive index of bonding layers 202A and 202B is 1.30 or higher. The high refractive index of the bonding layers 202A and 202B frustrates total internal reflection and improves the extraction of photons normally trapped within the LED die. The bonding layers also provide a thermal conduction path from the wavelength conversion chips 50A and 50B to LED 100. Heat generated inside wavelength conversion chip 50A can pass through the bonding layer 202A and through LED 100 to a heat sink (not shown) attached to the bottom surface 114 of the LED. Heat generated inside wavelength conversion chip 50B can pass through the bonding layer 202B, through wavelength conversion chip 50A, through bonding layer 202A and through LED 100 to a heat sink (not shown) attached to the bottom surface 114 of the LED. Example materials and deposition methods for bonding layers 202A and 202B have been listed previously.

Figure 6B:
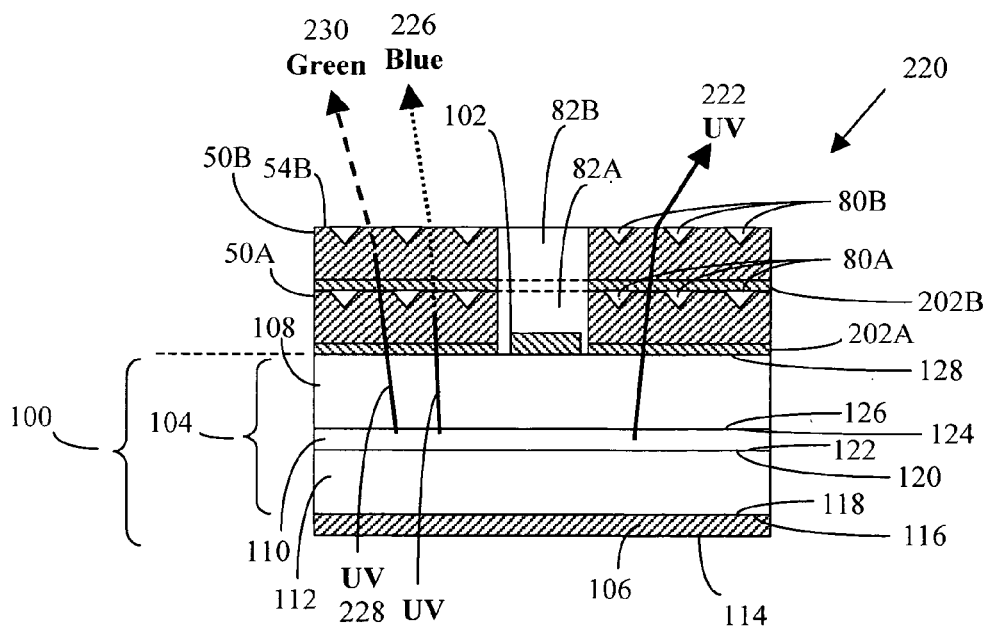
FIG. 6B is a side cross-sectional view showing example light rays emitted by the solid-state light source illustrated in FIG. 6A.

Example light rays 222, 224, 226, 228 and 230 in FIG. 6B illustrate the operation of solid-state light source 220. When an electrical current is applied through LED 100 via the first reflecting electrode 102 and the second reflecting electrode 106, the active region 110 emits internally generated light. The wavelength of the internally generated light can be any optical wavelength. Preferably the wavelength of the internally generated light is in the wavelength range from about 250 nm to about 500 nm. For illustrative purposes only, LED 100 is shown to emit UV light. For example, LED 100 can emit 360 nm UV light.

Internally generated UV light ray 222 is emitted by active region 110 of LED 100. UV light ray 222 is transmitted through the first doped semiconductor layer 108, through top surface 128 of LED 100, through bonding layer 202A, through wavelength conversion chip 50A without being converted, through bonding layer 202B and through the wavelength conversion chip 50B without being converted. UV light ray 222 exits solid-state light source 220 through surface 54B of the wavelength conversion chip 50B.

Internally generated UV light ray 224 is emitted by active region 110 of LED 100. UV light ray 224 is transmitted through the first doped semiconductor layer 108, through top surface 128 of LED 100, through bonding layer 202A and into the wavelength conversion chip 50A. Wavelength conversion chip 50A converts UV light ray 224 into blue light ray 226. The conversion of UV light ray 224 to blue light is an illustrative example. Depending on the composition of the wavelength conversion layer, the UV light could be converted instead into, for example, cyan, green, yellow, red or infrared light. Blue light ray 226 passes through the remainder of the wavelength conversion chip 50A, through bonding layer 202B, through wavelength conversion chip 50B without being converted and exits solid-state light source 220 through surface 54B of the wavelength conversion chip 50B.

Internally generated UV light ray 228 is emitted by active region 110 of LED 100. UV light ray 228 is transmitted through the first doped semiconductor layer 108, through top surface 128 of LED 100, through bonding layer 202A, through wavelength conversion chip 50A without being converted, through bonding layer 202B and into the wavelength conversion chip 50B. Wavelength conversion chip 50B converts UV light ray 228 into green light ray 230. Green light ray 230 passes through the remainder of the wavelength conversion chip 50B and exits the solid-state light source 220 through surface 54B of the wavelength conversion chip 50B.

The wavelength conversion chip 50A converts UV light ray 224 into blue light. The wavelength conversion chip 50B converts UV light ray 228 into green light. Light ray 222 passes through wavelength conversion chips 50A and 50B without conversion. Only a portion of the UV light passing through the wavelength conversion chips is converted into blue or green light. The wavelength conversion chip 50B does not convert the already converted blue light ray 226 from the wavelength conversion chip 50A. The blue light ray 226 is transmitted through the wavelength conversion chip 50B without being converted.

Figure 7A:
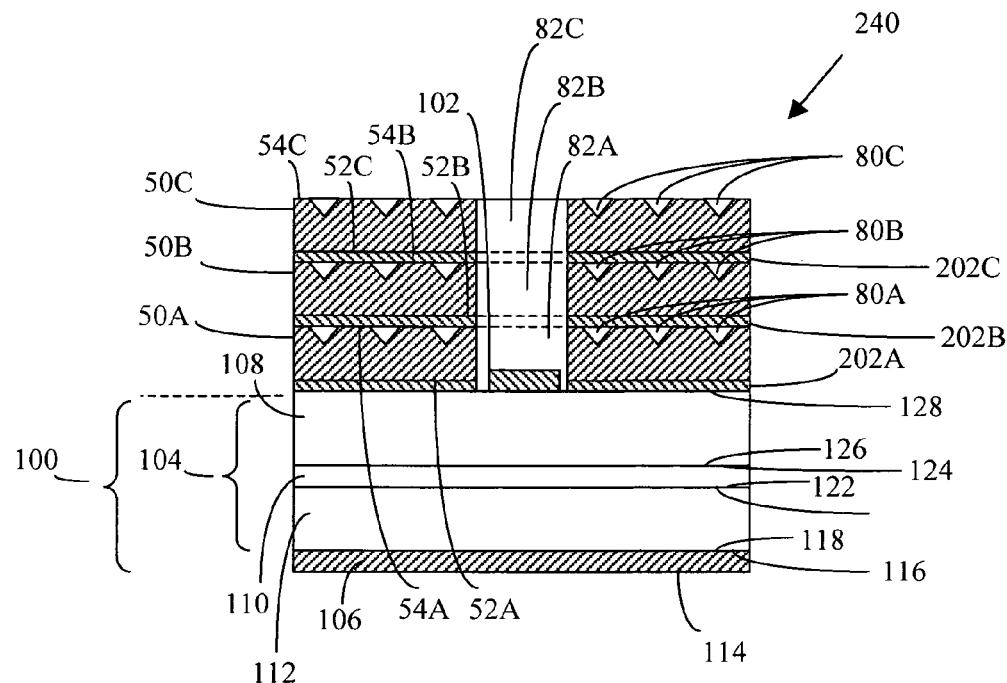
FIG. 7A is a side cross-sectional view of a solid-state light source that includes three wavelength conversion chips.
Figure 7B:
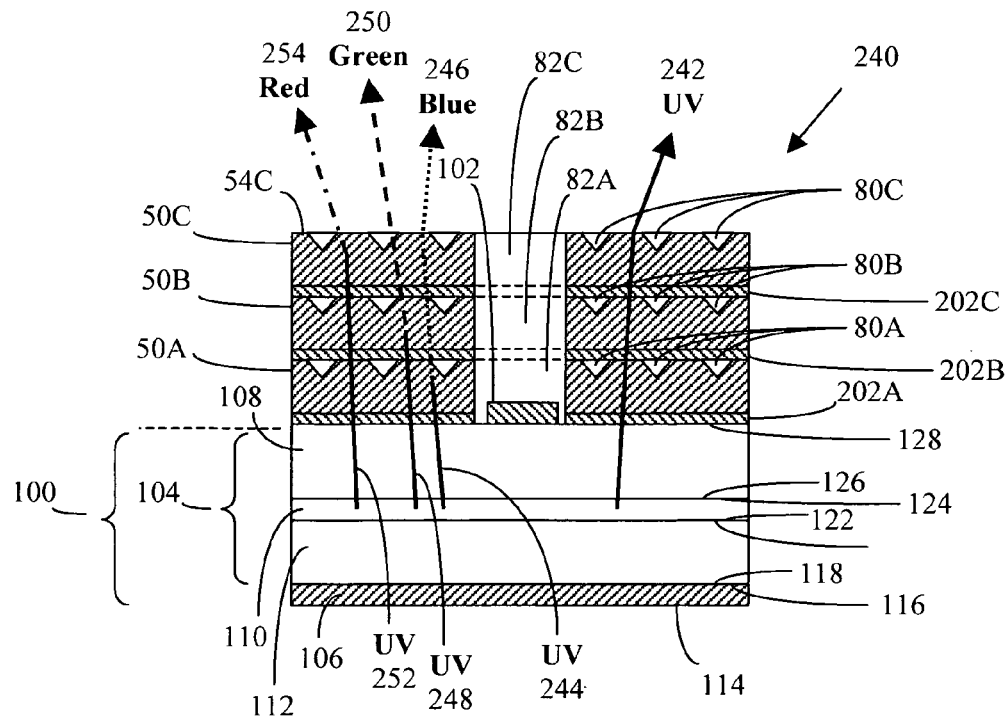
FIG. 7B is a side cross-sectional view showing example light rays emitted by the solid-state light source illustrated in FIG. 7A.
Figure 8A:
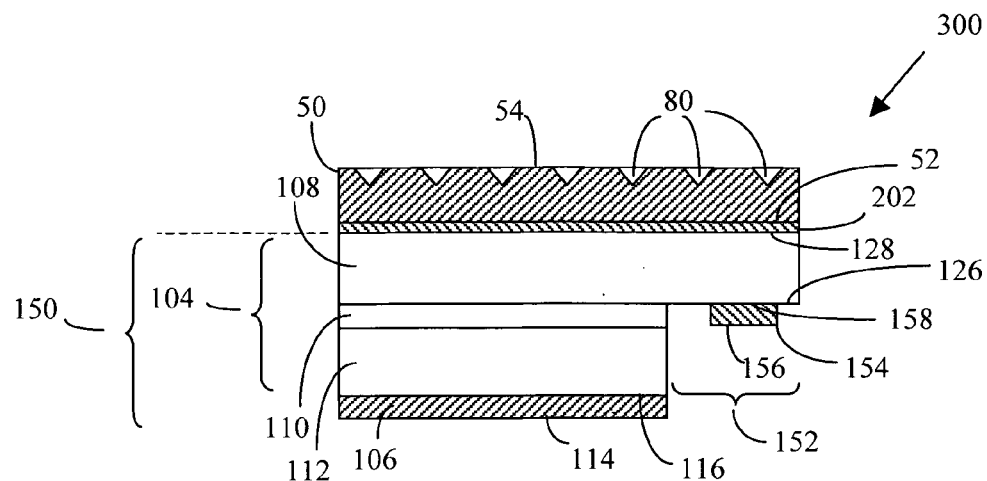
FIG. 8A is a side cross-sectional view of a solid-state light source that includes one wavelength conversion chip.
Figure 8B:
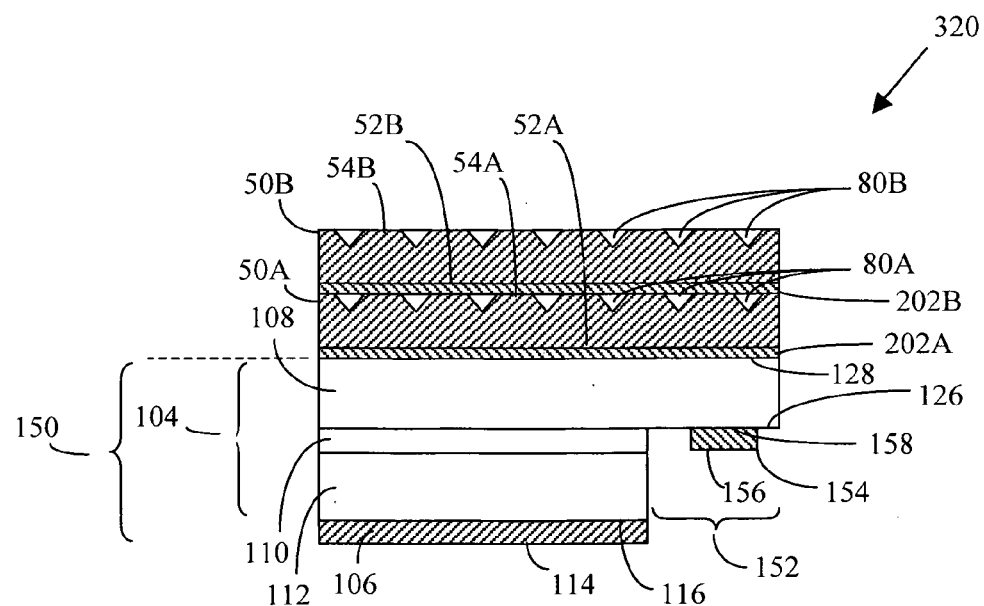
FIG. 8B is a side cross-sectional view of a solid-state light source that includes two wavelength conversion chips.
Figure 8C:
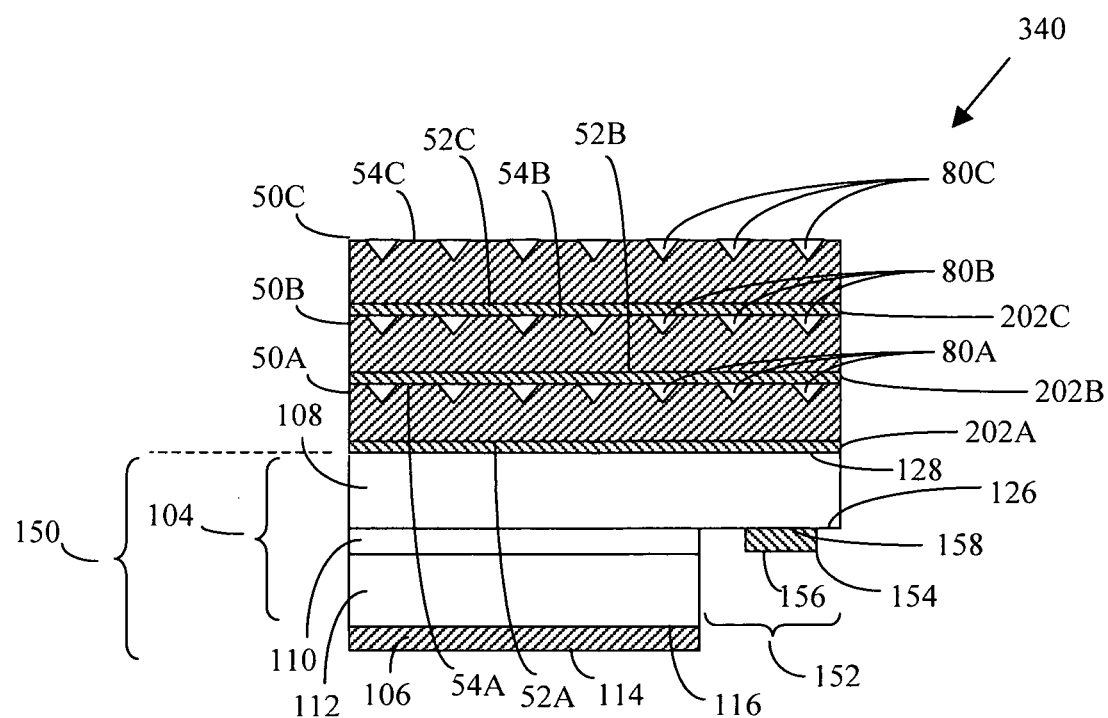
FIG. 8C is a side cross-sectional view of a solid-state light source that includes three wavelength conversion chips.

Another embodiment of this invention is solid-state light source 240 shown in a side cross-sectional view in FIG. 7A. Solid-state light source 240 includes LED 100, which has a top first reflecting electrode 102, three wavelength conversion chips 50A, 50B and 50C and three bonding layers 202A, 202B and 202C. The wavelength conversion chip 50A includes light extracting elements 80A and via 82A that extends through the chip. The wavelength conversion chip 50B includes light extracting elements 80B and via 82B that extends through the chip. The wavelength conversion chip 50C includes light extracting elements 80C and via 82C that extends through the chip.

LED 100 of solid-state light source 240 emits light in a first wavelength range. Wavelength conversion chip 50A converts light of a first wavelength range into light of a second wavelength range, different than the first wavelength range. The light of a second wavelength range has longer wavelengths than the light of a first wavelength range. Wavelength conversion chip 50B converts light of a first wavelength range into light of a third wavelength range, different than the first wavelength range and the second wavelength range. The light of a third wavelength range has longer wavelengths than the light of a first wavelength range. Wavelength conversion chip 50C converts light of a first wavelength range into light of a fourth wavelength range, different than the first wavelength range and the second wavelength range and the third wavelength range. The light of a fourth wavelength range has longer wavelengths than the light of a first wavelength range.

In FIG. 7A, the wavelength conversion chips 50A, 50B and 50C cover the entire surface 128 of LED 100 except for the area occupied by vias 82A, 82B and 82C. It is also within the scope of this invention that the wavelength conversion chips 50A, 50B and 50C may have an area that is larger or smaller than the area of the top surface 128 of LED 100.

The wavelength conversion chips are attached to LED 100 by transparent and thermally conducting bonding layers 202A, 202B and 202C. Preferably the refractive index of bonding layers 202A, 202B and 202C is 1.30 or higher. The high refractive index of the bonding layers 202A, 202B and 202C frustrates total internal reflection and improves the extraction of photons normally trapped within the LED die. The bonding layers also provide a thermal conduction path from the wavelength conversion chips 50A, 50B and 50C to LED 100. Heat generated inside wavelength conversion chip 50A can pass through the bonding layer 202A and through LED 100 to a heat sink (not shown) attached to the bottom surface 114 of the LED. Heat generated inside wavelength conversion chip 50B can pass through the bonding layer 202B, through wavelength conversion chip 50A, through bonding layer 202A and through LED 100 to a heat sink (not shown) attached to the bottom surface 114 of the LED. Heat generated inside wavelength conversion chip 50C can pass through the bonding layer 202C, through the wavelength conversion chip 50B, through the bonding layer 202B, through wavelength conversion chip 50A, through bonding layer 202A and through LED 100 to a heat sink (not shown) attached to the bottom surface 114 of the LED. Example materials and deposition methods for bonding layers 202A, 202B and 202C have been listed previously.

Example light rays 242, 244, 246, 248, 250, 252 and 254 illustrate the operation of solid-state light source 240. When an electrical current is applied through LED 100 via the first reflecting electrode 102 and the second reflecting electrode 106, the active region 110 emits internally generated light. The wavelength of the internally generated light can be any optical wavelength. Preferably the wavelength of the internally generated light is in the wavelength range from about 250 nm to about 500 nm. For illustrative purposes only, LED 100 is shown to emit UV light. For example, LED 100 can emit 360 nm UV light.

Internally generated UV light ray 242 is emitted by active region 110 of LED 100. UV light ray 242 is transmitted through the first doped semiconductor layer 108, through top surface 128 of LED 100, through bonding layer 202A, through wavelength conversion chip 50A without being converted, through bonding layer 202B, through the wavelength conversion chip 50B without being converted, through bonding layer 202C and through wavelength conversion chip 50C without being converted. UV light ray 242 exits solid-state light source 240 through surface 54C of the wavelength conversion chip 50C.

Internally generated UV light ray 244 is emitted by active region 110 of LED 100. UV light ray 224 is transmitted through the first doped semiconductor layer 108, through top surface 128 of LED 100, through bonding layer 202A and into the wavelength conversion chip 50A. Wavelength conversion chip 50A converts UV light ray 244 into blue light ray 246. The conversion of UV light ray 244 to blue light is an illustrative example. Depending on the composition of the wavelength conversion layer, the UV light could be converted instead into, for example, cyan, green, yellow, red or infrared light. Blue light ray 246 passes through the remainder of the wavelength conversion chip 50A, through bonding layer 202B, through wavelength conversion chip 50B without being converted, through bonding layer 202C, through wavelength conversion chip 50C without being converted and exits solid-state light source 240 through surface 54C of the wavelength conversion chip 50C.

Internally generated UV light ray 248 is emitted by active region 110 of LED 100. UV light ray 248 is transmitted through the first doped semiconductor layer 108, through top surface 128 of LED 100, through bonding layer 202A, through wavelength conversion chip 50A without being converted, through bonding layer 202B and into the wavelength conversion chip 50B. Wavelength conversion chip 50B converts UV light ray 248 into green light ray 250. Green light ray 250 passes through the remainder of the wavelength conversion chip 50B, through bonding layer 202C, through wavelength conversion chip 50C without being converted and exits the solid-state light source 240 through surface 54C of the wavelength conversion chip 50C.

Internally generated UV light ray 252 is emitted by active region 110 of LED 100. UV light ray 252 is transmitted through the first doped semiconductor layer 108, through top surface 128 of LED 100, through bonding layer 202A, through wavelength conversion chip 50A without being converted, through bonding layer 202B, through wavelength conversion chip 50B without being converted, through bonding layer 202C and into the wavelength conversion chip 50C. Wavelength conversion chip 50C converts UV light ray 252 into red light ray 254. Red light ray 254 passes through the remainder of the wavelength conversion chip 50C and exits the solid-state light source 240 through surface 54C of the wavelength conversion chip 50C.

The wavelength conversion chip 50A converts UV light ray 244 into blue light. The wavelength conversion chip 50B converts UV light ray 248 into green light. The wavelength conversion chip 50C converts UV light ray 252 into red light. Light ray 242 passes through wavelength conversion chips 50A, 50B and 50C without conversion. Only a portion of the UV light passing through the wavelength conversion chips is converted into blue, green or red light. The wavelength conversion chips 50B and 50C do not convert the already converted blue light ray 246 from the wavelength conversion chip 50A. The blue light ray 246 is transmitted through the wavelength conversion chips 50B and 50C without being converted. The wavelength conversion chip 50C does not convert the already converted green light ray 250 from the wavelength conversion chip 50B. The green light ray 250 is transmitted through the wavelength conversion chip 50C without being converted.

FIGS. 8A-8C illustrate embodiments of this invention that utilize LED 150. LED 150 has the first reflecting electrode 154 positioned on the bottom surface 126 of the first doped semiconductor 108. Since there is no top electrode on LED 150, the wavelength conversion chips do not require via holes in order to make electrical contact to the first reflecting electrode.

Example light rays will not be illustrated in FIGS. 8A-8C since the conversion of UV light, for example, into blue, green or red light occurs in the same manner as previously illustrated light rays in FIGS. 5, 6 and 7.

Another embodiment of this invention is solid-state light source 300 shown in a side cross-sectional view in FIG. 8A. Solid-state light source 300 includes LED 150, which has a first reflecting electrode 154 positioned on the bottom surface 126 of the first doped semiconductor layer 108, wavelength conversion chip 50 and a bonding layer 202. The wavelength conversion chip 50 includes light extracting elements 80 and does not include a via.

In FIG. 8A, the wavelength conversion chip covers the entire surface 128 of LED 150. It is also within the scope of this invention that the wavelength conversion chip 50 may have an area that is larger or smaller than the area of the top surface 128 of LED 150.

The wavelength conversion chip is attached to LED 150 by a transparent and thermally conducting bonding layer 202. Preferably the refractive index of bonding layer 202 is 1.30 or higher. The high refractive index of the bonding layer 202 frustrates total internal reflection and improves the extraction of photons normally trapped within the LED die. The bonding layer also provides a thermal conduction path from the wavelength conversion chip 50 to LED 150. Heat generated inside the wavelength conversion chip 50 can pass through the bonding layer 202 and through LED 150 to a heat sink (not shown) attached to the bottom surface 114 of the LED. Example bonding layer materials have been listed previously.

The wavelength conversion chip 50 converts light of a first wavelength range emitted by LED 150 into light of a second wavelength range. For example, wavelength conversion chip can convert UV light into blue light.

Another embodiment of this invention is solid-state light source 320 shown in a side cross-sectional view in FIG. 8B. Solid-state light source 320 includes LED 150, which has a first reflecting electrode 154 positioned on the bottom surface 126 of the first doped semiconductor layer 108, two wavelength conversion chips 50A and 50B and two bonding layers 202A and 202B. The wavelength conversion chip 50A includes light extracting elements 80A and the wavelength conversion chip 50B includes light extracting elements 80B.

In FIG. 8B, the wavelength conversion chips 50A and 50B cover the entire surface 128 of LED 150. It is also within the scope of this invention that the wavelength conversion chips 50A and 50B may have an area that is larger or smaller than the area of the top surface 128 of LED 150.

The wavelength conversion chips are attached to LED 150 by transparent and thermally conducting bonding layers 202A and 202B. Preferably the refractive index of bonding layers 202A and 202B is 1.30 or higher. The bonding layers also provide a thermal conduction path from the wavelength conversion chips 50A and 50B to LED 150. Heat generated inside wavelength conversion chip 50A can pass through the bonding layer 202A and through LED 150 to a heat sink (not shown) attached to the bottom surface 114 of the LED. Heat generated inside wavelength conversion chip 50B can pass through the bonding layer 202B, through wavelength conversion chip 50A, through bonding layer 202A and through LED 150 to a heat sink (not shown) attached to the bottom surface 114 of the LED. Example materials and deposition methods for bonding layers 202A and 202B have been listed previously.

As an illustrative example, the wavelength conversion chip 50A converts UV light into blue light. The wavelength conversion chip 50B converts UV light into green light.

Another embodiment of this invention is solid-state light source 340 shown in a side cross-sectional view in FIG. 8C. Solid-state light source 340 includes LED 150, which has a first reflecting electrode 154 positioned on the bottom surface 126 of the first doped semiconductor layer 108, three wavelength conversion chips 50A, 50B and 50C and three bonding layers 202A, 202B and 202C. The wavelength conversion chip 50A includes light extracting elements 80A. The wavelength conversion chip 50B includes light extracting elements 80B. The wavelength conversion chip 50C includes light extracting elements 80C.

In FIG. 8C, the wavelength conversion chips 50A, 50B and 50C cover the entire surface 128 of LED 150. It is also within the scope of this invention that the wavelength conversion chips 50A, 50B and 50C may have an area that is larger or smaller than the area of the top surface 128 of LED 150.

The wavelength conversion chips are attached to LED 150 by transparent and thermally conducting bonding layers 202A, 202B and 202C. Preferably the refractive index of bonding layers 202A, 202B and 202C is 1.30 or higher. The bonding layers also provide a thermal conduction path from the wavelength conversion chips 50A, 50B and 50C to LED 150. Heat generated inside wavelength conversion chip 50A can pass through the bonding layer 202A and through LED 150 to a heat sink (not shown) attached to the bottom surface 114 of the LED. Heat generated inside wavelength conversion chip 50B can pass through the bonding layer 202B, through wavelength conversion chip 50A, through bonding layer 202A and through LED 150 to a heat sink attached to the bottom surface 114 of the LED. Heat generated inside wavelength conversion chip 50C can pass through the bonding layer 202C, through the wavelength conversion chip 50B, through the bonding layer 202B, through wavelength conversion chip 50A, through bonding layer 202A and through LED 150 to a heat sink attached to the bottom surface 114 of the LED. Example materials and deposition methods for bonding layers 202A, 202B and 202C have been listed previously.

As an illustrative example, the wavelength conversion chip 50A converts UV light into blue light. The wavelength conversion chip 50B converts UV light into green light. The wavelength conversion chip 50C converts UV light into red light.

Figure 9A:
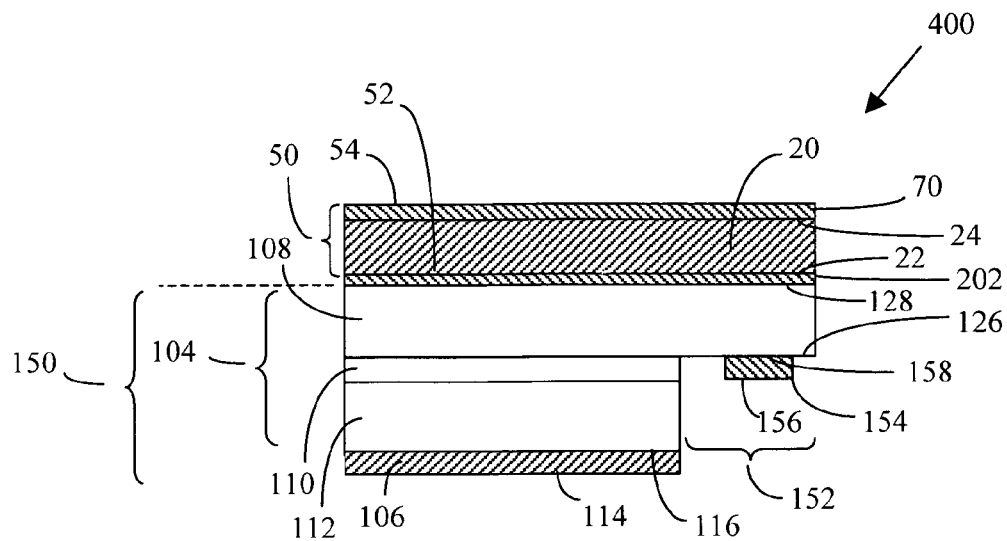
FIG. 9A is a side cross-sectional view of a solid-state light source that includes one wavelength conversion chip that has an optical coating.
Figure 9B:
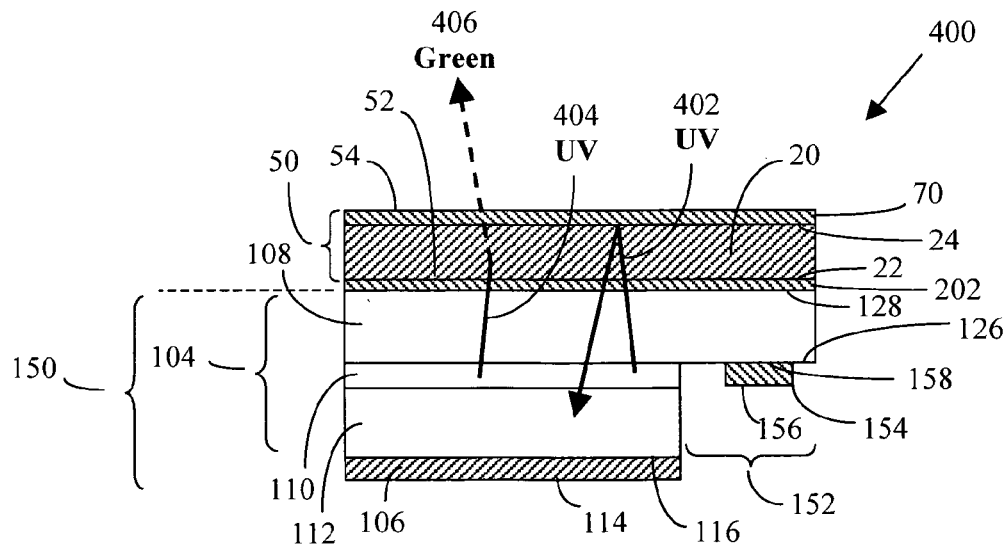
FIG. 9B is a side cross-sectional view showing example light rays emitted by the solid-state light source illustrated in FIG. 9A.

FIGS. 9A and 9B illustrate side cross-sectional views of another embodiment of this invention, solid-state light source 400. Solid-state light source 400 has a wavelength conversion chip that includes an optical coating. The optical coating in this example is a dichroic mirror.

Solid-state light source 400 includes LED 150, which has a first reflecting electrode 154 positioned on the bottom surface 126 of the first doped semiconductor layer 108, a wavelength conversion chip 50 and a bonding layer 202. The wavelength conversion chip 50 includes an optical coating 70, but in this example the wavelength conversion chip does not include light extracting elements or a via. However, it is within the scope of this invention that the wavelength conversion chip can optionally include light extracting elements and vias in addition to the optical coating 70. It is also within the scope of this invention that a wavelength conversion chip that has an optical coating may also be used with other types of LEDs such as LED 100.

In FIG. 9A, the wavelength conversion chip covers the entire surface 128 of LED 150. It is also within the scope of this invention that the wavelength conversion chip 50 may have an area that is larger or smaller than the area of the top surface 128 of LED 150.

The wavelength conversion chip is attached to LED 150 by a transparent and thermally conducting bonding layer 202. Preferably the refractive index of bonding layer 202 is 1.30 or higher. The bonding layer also provides a thermal conduction path from the wavelength conversion chip 50 to LED 150. Heat generated inside the wavelength conversion chip 50 can pass through the bonding layer 202 and through LED 150 to a heat sink (not shown) attached to the bottom surface 114 of the LED. Example bonding layer materials have been listed previously.

The wavelength conversion layer 20 of the wavelength conversion chip 50 converts light of a first wavelength range emitted by LED 150 into light of a second wavelength range. For example, the wavelength conversion layer can convert UV light into green light.

The optical coating 70 is on the top surface 24 of the wavelength conversion layer 20 and is also on the top surface 54 of the wavelength conversion chip 50. The optical coating 70 is a dichroic mirror in this example. The dichroic mirror transmits light in a first wavelength range and reflects light in a second wavelength range. For example, if the LED 150 emits UV light and the wavelength conversion chip converts UV light into green light, then the dichroic mirror is preferably designed to transmit green light and to reflect UV light. The dichroic mirror prevents UV light from exiting the solid-state light source 400 and causes the UV light to be recycled back through the wavelength conversion layer a second time in order to increase the amount of green light produced by the solid-state light source.

Another example (not shown) of an optical coating is a reflecting polarizer. A reflecting polarizer reflects light of a first polarization state and transmits light of a second polarization state. The reflected light of a first polarization state is recycled back to LED 150 as externally incident light.

In cases where a portion of the internally generated light emitted by LED 150 is reflecting by an optical coating and recycled back to LED 150 as externally incident light, preferably LED 150 is designed to reflect a significant fraction of the externally incident light. The overall reflectivity of LED 150 to externally incident light depends on several factors including the absorption coefficient of the multi-layer semiconductor structure 104, the reflectivity of the first reflecting electrode 154 and the reflectivity of the second reflecting electrode 106. By lowering the absorption coefficient of the multi-layer semiconductor structure, the reflectivity of LED 150 to externally incident light will increase. Furthermore, increasing the reflectivity of the first reflecting electrode and/or the second reflecting electrode will increase the reflectivity of LED 150 to externally incident light.

In order to maximize the reflectivity of LED 150 to externally incident light, preferably the absorption coefficient (i.e. the thickness-weighted average absorption coefficient of the multiple layers) of the multi-layer semiconductor structure 104 in the emitting wavelength range of the internally generated light is less than 50 $cm^{-1}$. More preferably, the absorption coefficient of the multi-layer semiconductor structure in the emitting wavelength range is less than 25 $cm^{-1}$. Most preferably, the absorption coefficient of the multi-layer semiconductor structure in the emitting wavelength range is less than 10 $cm^{-1}$.

Furthermore, in order to improve the reflectivity of LED 150 to externally incident light, preferably the surface 158 of the first reflecting electrode 154 has a reflectivity greater than 60 percent in the emitting wavelength range. More preferably, the surface 158 of the first reflecting electrode 154 has a reflectivity greater than 80 percent in the emitting wavelength range. Suitable materials for the first reflecting electrode that have a reflectivity greater than 80 percent include aluminum and silver.

The second reflecting electrode 106 covers a larger surface area than the first reflecting electrode 154. Consequently, the reflectivity of the second reflecting electrode is more critical than the reflectivity of the first metal electrode. In order to improve the reflectivity of LED 150 to externally incident light, preferably the reflectivity of surface 116 of the second reflecting electrode 106 is greater than 85 percent in the emitting wavelength range. More preferably the reflectivity of the surface 116 of the second reflecting electrode is greater than 90 percent in the emitting wavelength range. Most preferably, the reflectivity of the surface 116 of the second reflecting electrode is greater than 95 percent in the emitting wavelength range. A suitable material for the second reflecting electrode that has a reflectivity greater than 95 percent is silver. In the illustrative example for LED 150, the second reflecting electrode is fabricated from silver.

The overall reflectivity of LED 150 to externally incident light is preferably greater than 50 percent. More preferably, the overall reflectivity of LED 150 to externally incident light is greater than 60 percent.

When an electrical current is applied through LED 150 via the first reflecting electrode 154 and the second reflecting electrode 106, the active region 110 emits internally generated light. The wavelength of the internally generated light can be any optical wavelength. Preferably the wavelength of the internally generated light is in the wavelength range from about 250 nm to about 500 nm. For wavelength conversion applications, usually the wavelength of the internally generated light is in the ultraviolet (UV) or blue regions of the optical spectrum. For illustrative purposes only, LED 150 is shown to emit UV light. For example, LED 150 can emit 360 nm UV light.

Example light rays 402, 404 and 406 illustrate the operation of solid-state light source 400.

Internally generated UV light ray 402 is emitted by active region 110 of LED 150. UV light ray 402 is transmitted through the first doped semiconductor layer 108, through top surface 128 of LED 150, through bonding layer 202 and through the wavelength conversion layer 20 a first time without being converted. UV light ray 402 is reflected and recycled back toward LED 150 by optical coating 70, which is designed to reflect UV light. UV light ray 402 is transmitted through the wavelength conversion layer 20 a second time without being converted, through bonding layer 202 a second time and reenters LED 150 directed toward second reflecting electrode 106. Although in this example, UV light ray 402 was not converted during either the first or second passage through the wavelength conversion layer, it was possible for UV light ray 402 to be converted during either transit. The probability of conversion of the UV light ray 402 to, for example, green light depends on the absorption coefficient of the wavelength conversion layer to UV light. Increasing the number of transits by UV light through the wavelength conversion layer increases the probability of conversion. If UV light ray 402 is subsequently reflected (not shown) by the second reflecting electrode 106, UV light ray 402 may pass through the wavelength conversion layer a third time or more than three times.

Internally generated UV light ray 404 is emitted by active region 110 of LED 150. UV light ray 404 is transmitted through the first doped semiconductor layer 108, through top surface 128 of LED 100, through bonding layer 202 and into the wavelength conversion layer 20 of the wavelength conversion chip 50. Wavelength conversion layer 20 converts UV light ray 404 into green light ray 406. The conversion of UV light ray 404 to green light is an illustrative example. Depending on the composition of the wavelength conversion layer, the UV light could instead be converted into, for example, blue, cyan, yellow, red or infrared light. Green light ray 406 is transmitted through the remainder of the wavelength conversion layer 20, through optical coating 70, which is a dichroic mirror designed to transmit green light, and exits the wavelength conversion chip 50 and the solid-state light source 400 through surface 54.

FIGS. 1-3 illustrate examples of the fabrication of wavelength conversion chips where the wavelength conversion material is deposited on a substrate as a layer and the layer is then segmented into chips while the chips are still attached to the substrate. In other embodiments of this invention, the wavelength conversion layer is first removed from the substrate prior to segmentation into chips. Examples of such embodiments are described below.

Another embodiment of this invention is a process shown in FIGS. 10A-10I for forming wavelength conversion chips. The first step in the process for forming wavelength conversion chips is to select a substrate 10, which is shown in a side cross-sectional view in FIG. 10A. The substrate provides a physical support for the subsequent deposition of the wavelength conversion layer. Substrate 10 has a bottom surface 12 and a top surface 14 opposite bottom surface 12. Substrate 10 can be a polymeric material or an inorganic material. The material of substrate 10 can be amorphous, polycrystalline or a single-crystal and can be a heterogeneous material or a homogeneous material. If substrate 10 is a polymeric material or a thin flexible metal layer, substrate 10 can be a web that allows for a continuous web process. Depending on the later process steps, the substrate 10 may need to be transparent to light so that a laser liftoff process can be used to remove any deposited wavelength conversion layer. If a mechanical or chemical process is used in later steps to remove any deposited wavelength conversion layer from substrate 10, then substrate 10 does not need to be transparent. Example transparent polymeric materials include, but are not limited to, polyethylene and polyethylene terephthalate (PET). Example flexible metals include stainless steel, molybdenum and graphite. Example transparent inorganic materials include, but are not limited to, sapphire, silica and silicate glasses. Optionally, the top surface 14 of substrate 10 may include a release layer (not shown) to facilitate the removal of any subsequently deposited materials. The release layer is removed by thermal, radiation or mechanical means to separate the wavelength conversion layer from the substrate and the release layer. Example materials for the release layer include, but are not limited to, polymer layers, thin metal layer or inorganic materials that preferentially absorb light.

Figure 10A:
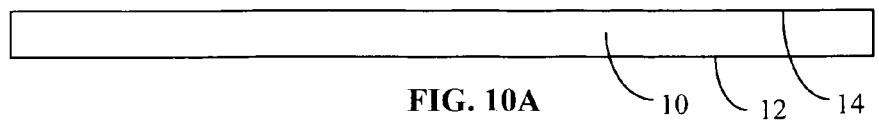
FIGS. 10A-10E are side cross-sectional views illustrating process steps needed to fabricate a wavelength conversion layer.
Figure 10B:
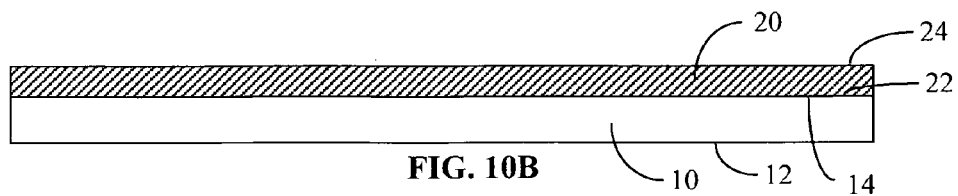

The next process step is to deposit a wavelength conversion layer 20 on the top surface 14 of substrate 10 as illustrated in a side cross-sectional view in FIG. 10B. The wavelength conversion layer 20 has a bottom surface 22 in contact with the top surface 14 of substrate 10 and a top surface 24.

The wavelength conversion layer 20 is formed from one or more wavelength conversion materials. The wavelength conversion materials may be, for example, phosphor materials or quantum dot materials or a plurality of such materials. The wavelength conversion layer 20 may also include optically inert host materials in addition to the phosphors or quantum dots. Examples of phosphor materials, quantum dot materials and inert host materials are described above for FIG. 1. When the wavelength conversion layer 20 is formed from phosphor materials, the phosphors can be deposited by a variety of techniques. The techniques include, but are not limited to, chemical vapor deposition (CVD), metal-organic chemical vapor deposition (MOCVD), sputtering, electron beam evaporation, laser deposition, sol-gel deposition, molecular beam epitaxy (MBE), liquid phase epitaxy (LPE), spin coating, doctor blading and tape casting. Preferred techniques include doctor blading, tape casting, CVD, MOCVD and sputtering. When the wavelength conversion layer is formed from quantum dot materials and inert host materials, deposition techniques include spin coating, doctor blading or tape casting, self assembly, lithography, and nanoimprinting.

The thickness of the wavelength conversion layer 20 can range from about 0.1 micron to about 5000 microns or more. Preferred thicknesses range from about 0.1 micron to about 500 microns.

Figure 10C:
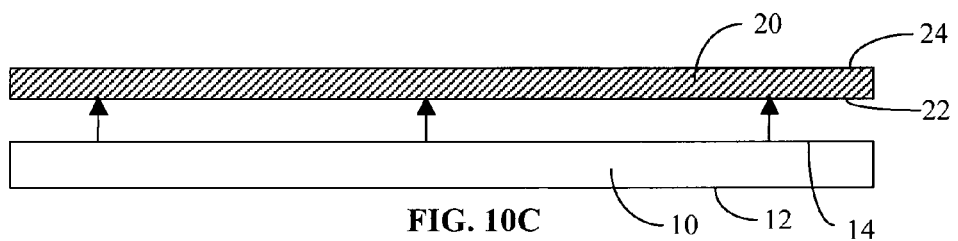

The next process step shown in FIG. 10C is removing the wavelength conversion layer 20 from substrate 10 by separating the bottom surface 22 of the wavelength conversion layer from the top surface 14 of the substrate. Methods of removing the wavelength conversion layer include using thermal heating to fracture the interface between the layer and the substrate, directing ion beam radiation through the wavelength conversion layer or the substrate to sever the interface, directing optical radiation such as pulsed laser radiation through the wavelength conversion layer or the substrate to sever the interface between the layer and the substrate, or using chemical or mechanical means to sever the interface. If the wavelength conversion layer is fabricated on a flexible substrate, mechanically flexing of the wavelength conversion layer or the flexible substrate will release the layer. The removal can be facilitated if the top surface 14 of substrate 10 includes a release layer (not shown) that can be degraded by thermal, radiation, chemical or mechanical means. The detached wavelength conversion layer has an exposed bottom surface 22.

Figure 10D:
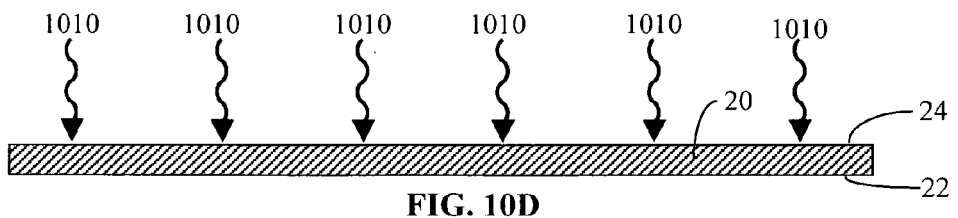
Figure 10E:
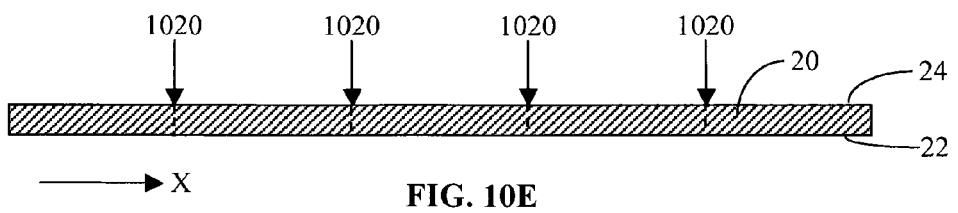
Figure 10F:
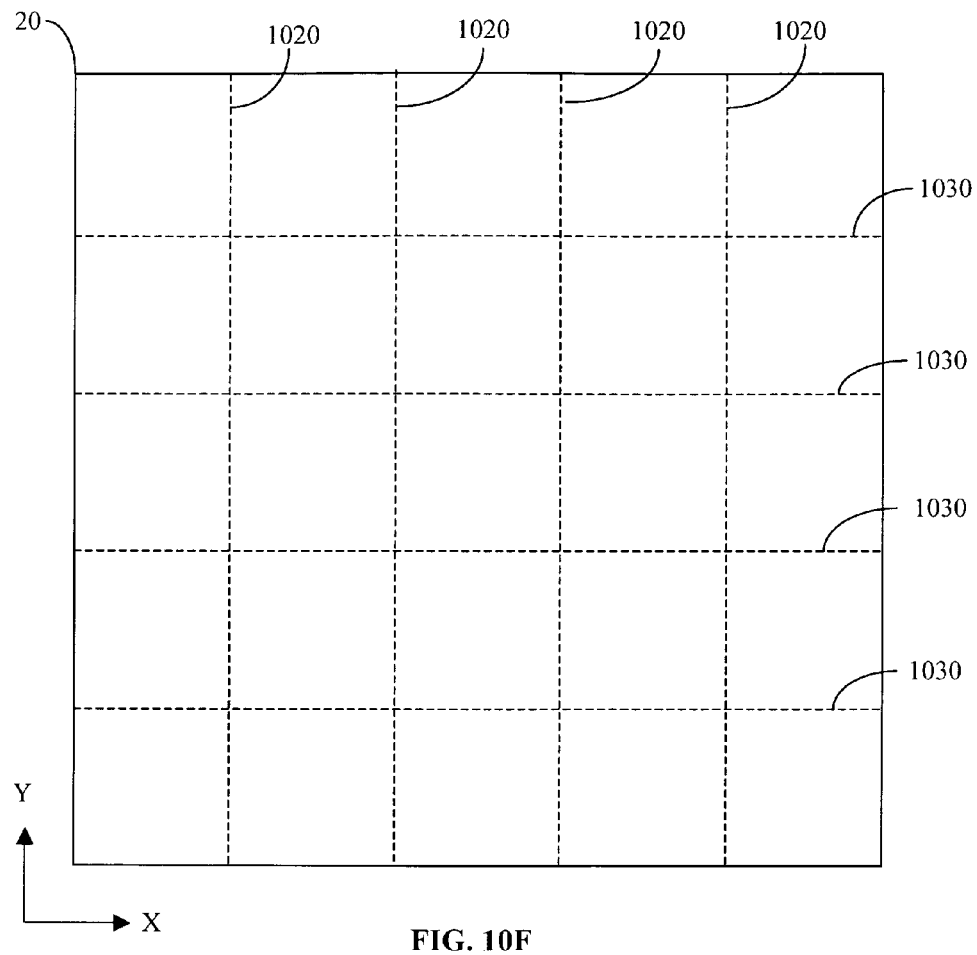
FIG. 10F is a top plan view of a wavelength conversion layer before it is segmented into wavelength conversion chips.
Figure 10G:
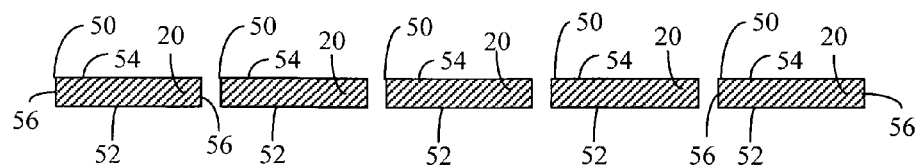
FIG. 10G is a side cross-sectional view of an array of wavelength conversion chips after segmentation.
Figure 10H:
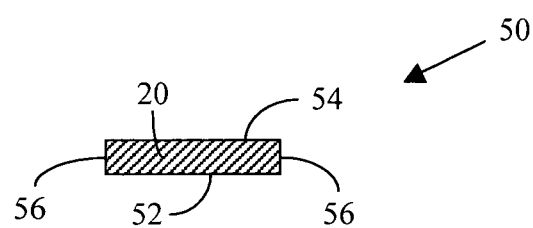
FIG. 10H is a side cross-sectional view and FIG. 10I is a top plan view of a wavelength conversion chip made by the process illustrated in FIGS. 10A-10G.

The next process step is an optional annealing step illustrated in FIG. 10D to thermally anneal or radiation anneal the wavelength conversion layer 20 in order to increase the wavelength conversion efficiency of the layer or, if the layer includes a phosphor powder, to sinter the powder to form a ceramic layer.

The annealing step is important for thin film phosphors, since as-deposited thin film phosphors may have low wavelength conversion efficiency if the deposited layer is not properly annealed. The annealing step can be any heat treatment or any radiation treatment of the wavelength conversion material in the wavelength conversion layer 20 that anneals the phosphor. Heating the wavelength conversion material in the wavelength conversion layer to, for example, 600 degrees Celsius for one hour can result in thermal annealing of the wavelength conversion material. Appropriate annealing temperatures and times may vary for different wavelength conversion materials. Example radiation annealing treatments include subjecting the wavelength conversion material in the wavelength conversion layer 20 to infrared, visible or ultraviolet light 1010 as shown in FIG. 10D or subjecting the wavelength conversion material in the wavelength conversion layer to electron beam, atomic beam or ion beam bombardment. The radiation sources may be pulsed or continuous. The light sources may be incoherent or coherent (e.g. laser) sources.

If the wavelength conversion material is a phosphor powder mixed with an organic binder, the annealing step may be done in two or more parts. For example, a low temperature (less than 300 degrees Celsius) anneal can be done to remove the organic binder material. Following the removal of the organic material, a high temperature (greater than 500 degrees Celsius) anneal can then be done to sinter the phosphor powder into a ceramic solid. The high temperature annealing step can be done between two graphite or metal plates to prevent the wavelength conversion layer from curling. Other methods, such as annealing a stack of two or more wavelength conversion layers at the same time, may also be utilized to prevent curling of the layers.

The annealing step is illustrated in FIG. 10D to occur after the removal of the wavelength conversion layer from the substrate. However, the annealing step may also be done earlier or later in the process sequence, including before the wavelength conversion layer is removed from the substrate or after the wavelength conversion layer is segmented into chips. Doing the annealing step after the wavelength conversion layer is removed from the substrate is necessary if the substrate 10 cannot withstand high temperature or high radiation processing. The annealing step may be done in air, in an inert atmosphere such as nitrogen or argon or in a partial vacuum as appropriate.

The next process step is to segment the wavelength conversion layer 20 into a plurality of wavelength conversion chips 50. Segmentation can be done in both the X and Y directions indicated in FIG. 10F. For example, the segmentation can occur through the wavelength conversion layer at the dashed lines 1020 illustrated in the side cross-sectional view in FIG. 10E and in the top plan view in FIG. 10F. The segmention can also occur along the dashed lines 1030 shown in FIG. 10F. Techniques for doing the segmentation include, but are not limited to, laser scribing, mechanical scribing, optical lithography accompanied by wet chemical etching, sputter etching or ion beam etching. After segmenting the wavelength conversion layer, wavelength conversion chips 50 are formed. The wavelength conversion chips are illustrated in side cross-sectional views in FIGS. 10G and 10H and in a top plan view in FIG. 10I. The wavelength conversion chips have a bottom surface 52, a top surface 54 and side surfaces 56.

Figure 10I:
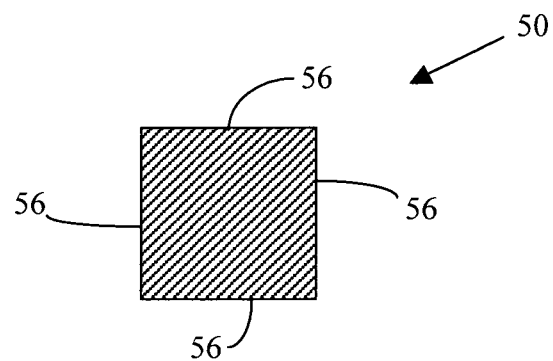

FIG. 10I illustrates a square shaped wavelength conversion chip. However, the wavelength conversion chips may have any shape including, but not limited to, a square, a rectangle, a polygon, a circle, an oval. Preferably the bottom surface 52 and the top surface 54 of the wavelength conversion chips are substantially coplanar to allow easy attachment to LEDs.

Another embodiment of this invention is a process shown in FIGS. 11A-11J for forming wavelength conversion chips that optionally include an optical coating 70 on at least one surface of the chips. Examples of optical coatings include a dichroic coating that transmits light of a first wavelength range and reflects light of a second wavelength range, an antireflection coating, a reflecting polarizer coating or a photonic bandgap coating. The coating examples are described in more detail in the descriptions of the coatings for FIG. 2.

The elements with the same numerical reference in FIG. 11 as in FIGS. 1 and 10 are the same elements as in FIGS. 1 and 10 and have the same properties as the elements in FIGS. 1 and 10. Some of the steps of the process shown in FIG. 11 are identical to the process steps outlined above in FIG. 10. In particular, the step of selecting a substrate 10 in FIG. 11A is identical to the step described for FIG. 10A. The step of depositing a wavelength conversion layer 20 on the substrate in FIG. 11B is identical to the step described for FIG. 10B. The step of removing the wavelength conversion layer from the substrate in FIG. 11C is identical to the step described for FIG. 10C. The step of optionally annealing the wavelength conversion layer in FIG. 11D is identical to the step described for FIG. 10D.

Figure 11A:
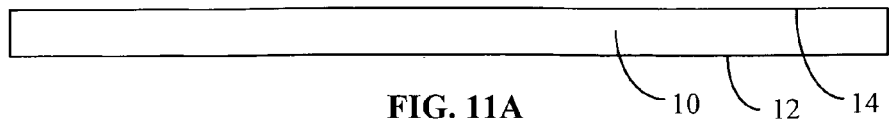
FIGS. 11A-11F are side cross-sectional views illustrating process steps needed to fabricate a wavelength conversion layer that includes an optical coating on one surface.
Figure 11B:
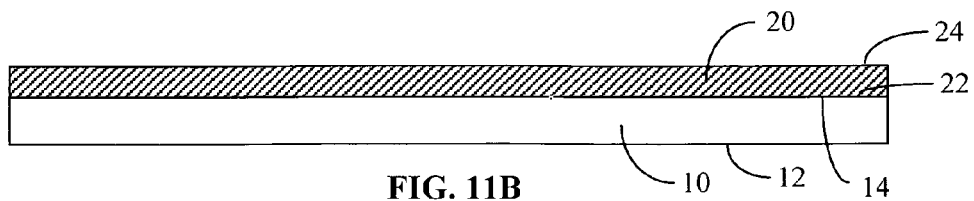
Figure 11C:
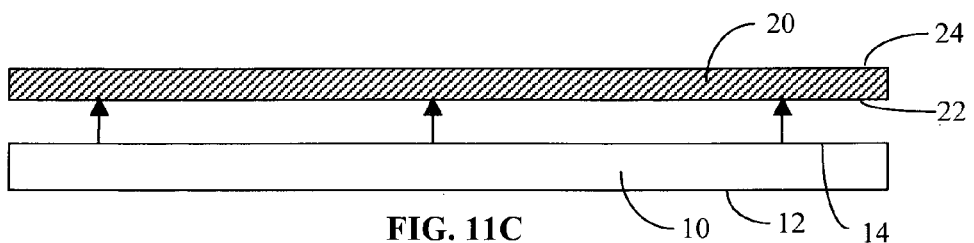
Figure 11D:
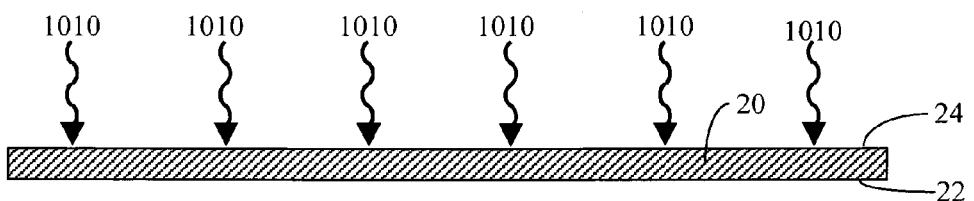
Figure 11E:
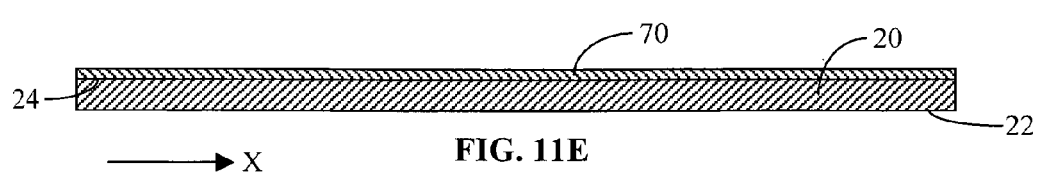
Figure 11F:
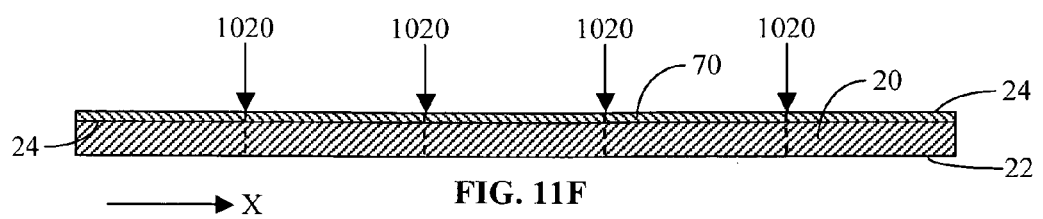
Figure 11G:
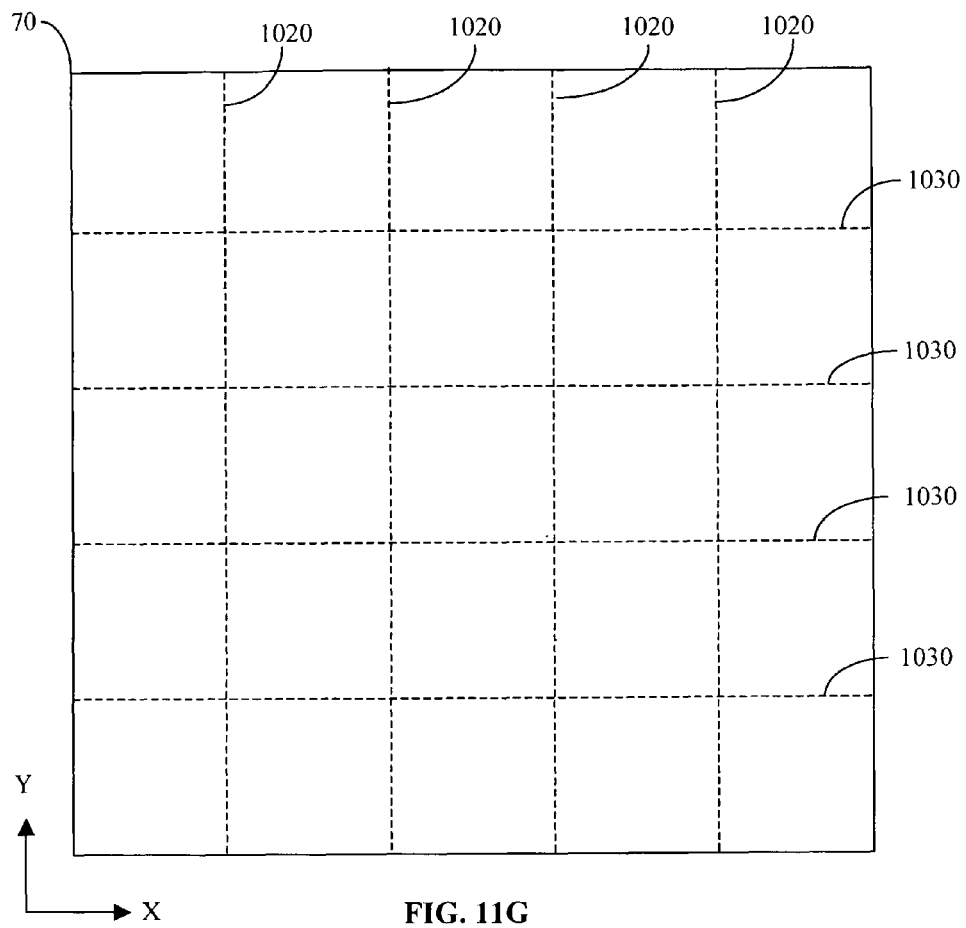
FIG. 11G is a top plan view of a wavelength conversion layer before it is segmented into wavelength conversion chips. The wavelength conversion layer has an optical coating on one surface.
Figure 11H:
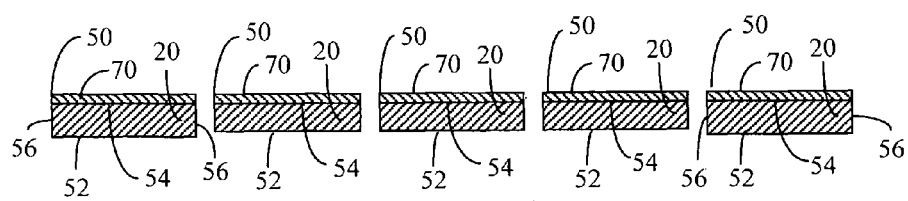
FIG. 11H is a side cross-sectional view of an array of wavelength conversion chips after segmentation. The wavelength conversion chips each have an optical coating on one side.
Figure 11I:
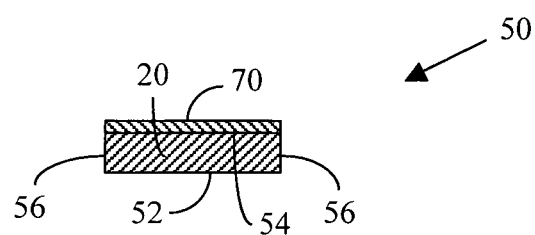
FIG. 11I is a side cross-sectional view and FIG. 11J is a top plan view of a wavelength conversion chip made by the process illustrated in FIGS. 11A-11H. The wavelength conversion chip has an optical coating on one side.

The next step following the optional annealing step is to deposit an optical coating 70 to the top surface 24 of the wavelength conversion layer. The coating is shown in FIG. 11E and can be deposited by a variety of techniques including, but not limited to, chemical vapor deposition (CVD), metal-organic chemical vapor deposition (MOCVD), sputtering, electron beam evaporation, laser deposition, sol-gel deposition, molecular beam epitaxy (MBE), liquid phase epitaxy (LPE) or spin coating. In FIG. 11E, the optical coating is deposited on the wavelength conversion layer following the optional annealing step. However, the optical coating can be applied at an earlier step or at a later step in the overall process. For example the optical coating could be applied before the wavelength conversion layer is removed from the substrate or the optical coating could be applied after the wavelength conversion layer is segmented into chips.

The next process step is to segment the wavelength conversion layer 20 and the optical coating 70 into a plurality of wavelength conversion chips 50. Segmentation can be done in both the X and Y directions indicated in FIG. 11G. For example, the segmentation can occur through the optical coating and the wavelength conversion layer at the dashed lines 1020 illustrated in the side cross-sectional view in FIG. 11F and in the top plan view in FIG. 11G. The segmention can also occur along the dashed lines 1030 shown in FIG. 11G. Techniques for doing the segmentation include, but are not limited to, laser scribing, mechanical scribing, optical lithography accompanied by wet chemical etching, sputter etching or ion beam etching. After segmenting the wavelength conversion layer that includes an optical coating, wavelength conversion chips 50 are formed that have an optical coating on surface 24 of the wavelength conversion layer. The wavelength conversion chips are illustrated in side cross-sectional views in FIGS. 11H and 11I and in a top plan view in FIG. 11J. The wavelength conversion chip includes a wavelength conversion layer that has a bottom surface 52, side surfaces 56 and a top surface 54 that is covered by the optical coating 70.

Figure 11J:
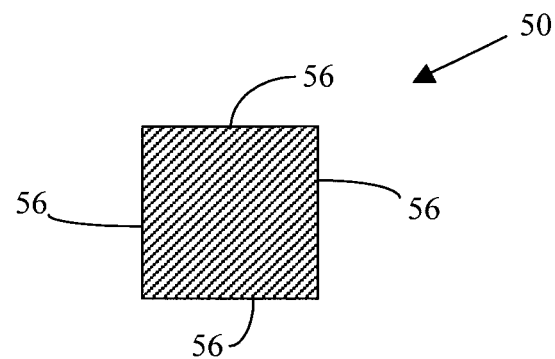

FIG. 11J illustrates a square shaped wavelength conversion chip that includes an optical coating. However, the wavelength conversion chips may have any shape including, but not limited to, a square, a rectangle, a polygon, a circle, an oval.

Another embodiment of this invention is a process shown in FIGS. 12A-12J for forming wavelength conversion chips that optionally include vias 82 that extend through the wavelength conversion chip or that optionally include arrays of light extracting elements 80.

The elements with the same numerical reference in FIG. 12 as in FIGS. 1 and 10 are the same elements as in FIGS. 1 and 10 and have the same properties as the elements in FIGS. 1 and 10. Some of the steps of the process shown in FIG. 12 are identical to the process steps outlined above in FIG. 10. In particular, the step of selecting a substrate 10 in FIG. 12A is identical to the step described for FIG. 10A. The step of depositing a wavelength conversion layer 20 on the substrate in FIG. 12B is identical to the step described for FIG. 10B. The step of removing the wavelength conversion layer from the substrate in FIG. 12C is identical to the step described for FIG. 10C. The step of optionally annealing the wavelength conversion layer in FIG. 12D is identical to the step described for FIG. 10D.

Figure 12A:
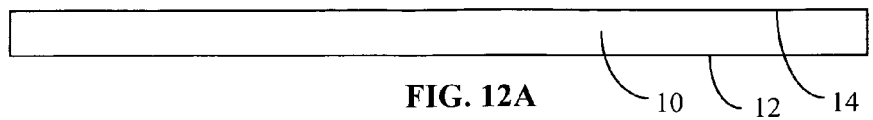
FIGS. 12A-12F are side cross-sectional views illustrating process steps needed to fabricate a wavelength conversion layer that includes vias and light extraction elements.
Figure 12B:
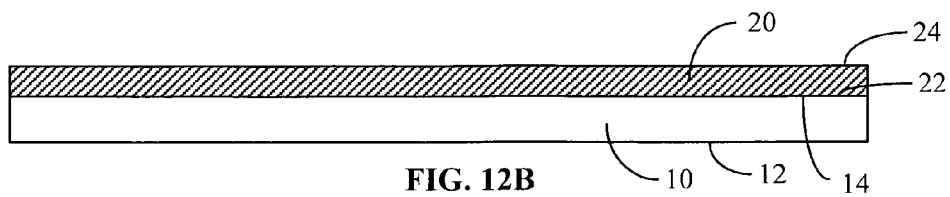
Figure 12C:
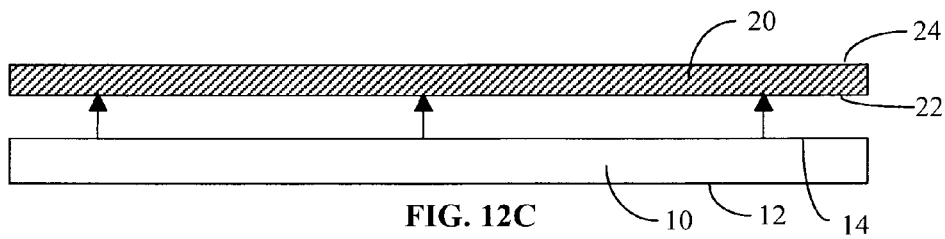
Figure 12D:
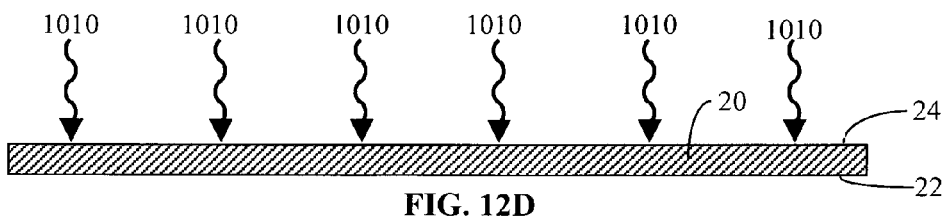
Figure 12E:
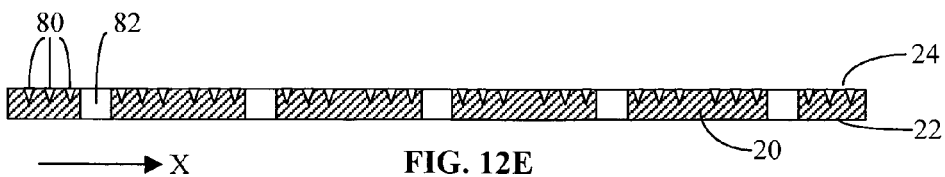
Figure 12F:
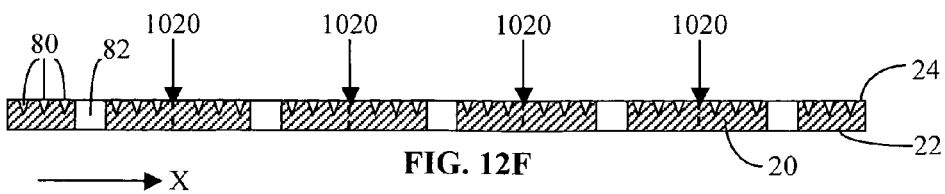
Figure 12G:
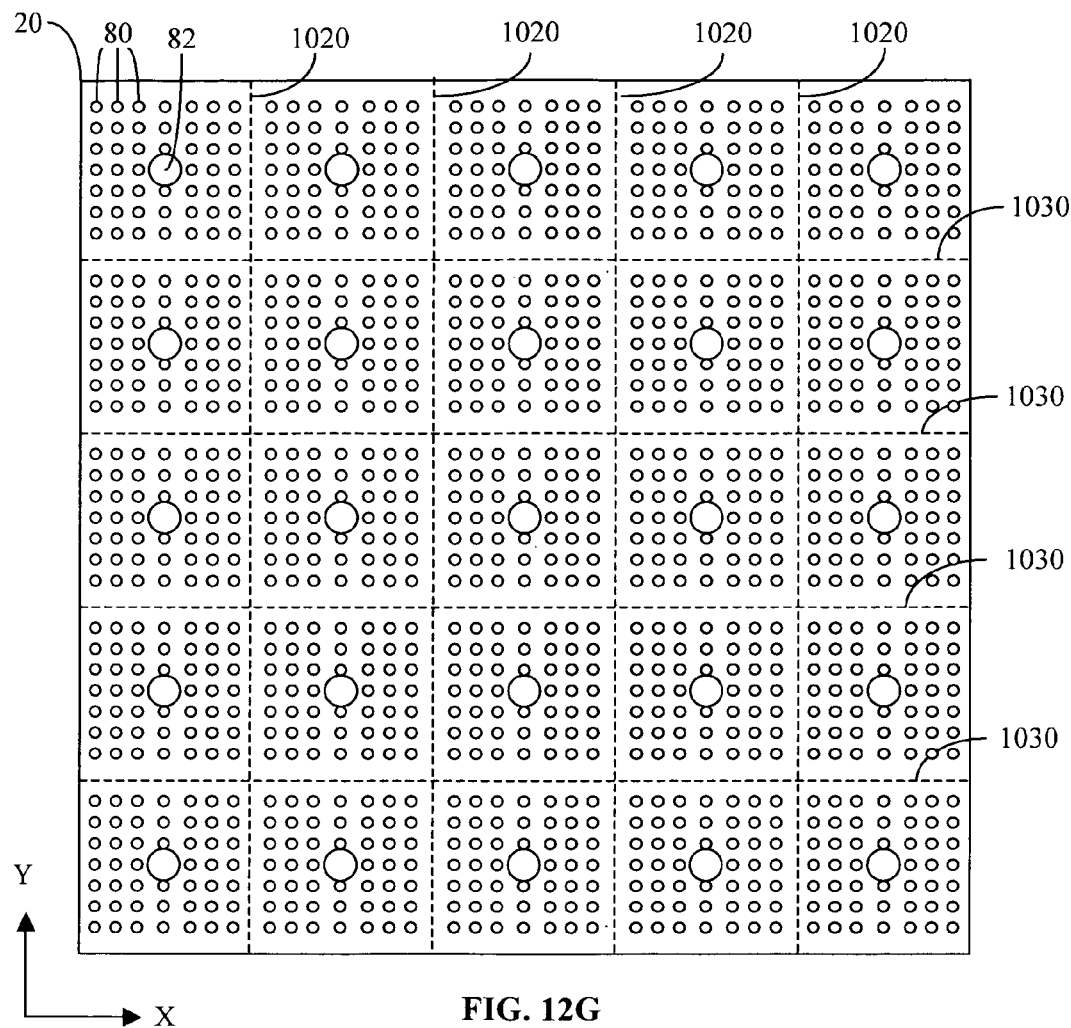
FIG. 12G is a top plan view of a wavelength conversion layer before it is segmented into wavelength conversion chips. The wavelength conversion layer includes vias and light extraction elements.
Figure 12H:
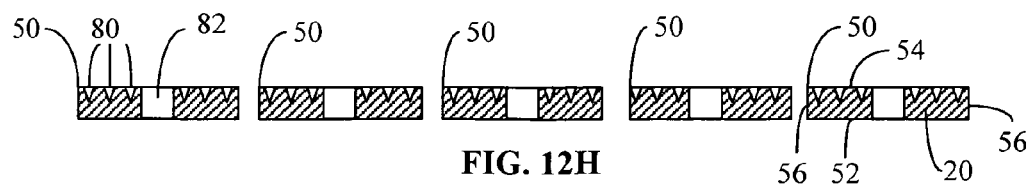
FIG. 12H is a side cross-sectional view of an array of wavelength conversion chips after segmentation. The wavelength conversion chips each have a via and light extraction elements.
Figure 12I:
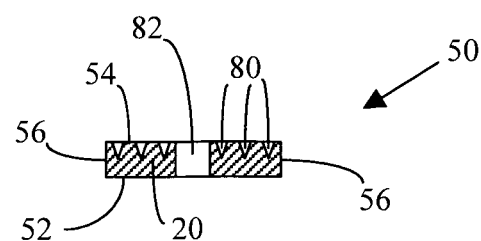
FIG. 12I is a side cross-sectional view and FIG. 12J is a top plan view of a wavelength conversion chip made by the process illustrated in FIGS. 12A-12H. The wavelength conversion chip has a via and light extraction elements.

The next step following the optional annealing step is to form one or more vias and/or one or more light extracting elements in the wavelength conversion layer 20. Via 82 is illustrated in FIGS. 12E-12J. Via 82 passes through the wavelength conversion layer 20 from side 22 to side 24 as shown in FIGS. 12E and 12F. Vias are required to form electrical pathways through the wavelength conversion layer and the final wavelength conversion chips. The vias may be air-filled vias or the vias may be filled with an electrically conducting material (not shown) such as a metal.

Light extracting elements 80 are elements that aid in the removal of light from the light emitting layers such as wavelength conversion layer 20 or wavelength conversion chip 50. In general, the refractive index of the wavelength conversion layer 20 or wavelength conversion chip 50 is higher than the refractive index of air. A portion of the light that is emitted by the wavelength conversion material can be trapped inside the wavelength conversion layer 20 or the wavelength conversion chip 50 by total internal reflection. Light extracting elements 80 cause a larger portion of the emitted light to exit the layer or chip. Examples of light extracting elements 80 include, but are not limited to, vertical holes, conical-shaped holes, holes with polygonal cross-sections, conical-shaped bumps, hemispherical-shaped bumps, bumps with polygonal cross-sections such as pyramids, grooves, ridges and subwavelength optical elements. Other examples of light extracting elements are arrays of subwavelength optical elements such as holes or grooves that are arranged to form photonic crystals. For illustrative purposes, the light extracting elements shown in FIGS. 12E-12J are conical-shaped holes.

The light extracting elements 80 may be formed on the top surface 24 of the wavelength conversion layer 20 and may extend either part way or all the way through the layer. If the light extracting elements are subwavelength optical elements, the light extracting elements may be positioned either on the top surface 24 of the chip or may be fabricated inside the chip.

Vias 82 and light extracting elements 80 may be formed by techniques that include, but are not limited to, laser ablation, mechanical etching, optical lithography accompanied by wet chemical etching, sputter etching or ion beam etching.

Vias 82 and light extracting elements 80 are shown in FIG. 12E to be fabricated in a process step that occurs after the optional annealing step for the wavelength conversion layer 20. However, it is within the scope of this invention that the fabrication of vias and light extracting elements may occur at other points in the overall process. For example, fabrication of vias and light extracting elements may be done before the annealing step or after the wavelength conversion layer is segmented into wavelength conversion chips.

The next process step is to segment the wavelength conversion layer 20 into a plurality of wavelength conversion chips 50. Segmentation can be done in both the X and Y directions indicated in FIG. 12G. For example, the segmentation can occur through the wavelength conversion layer at the dashed lines 1020 illustrated in the side cross-sectional view in FIG. 12F and in the top plan view in FIG. 12G. The segmention can also occur along the dashed lines 1030 shown in FIG. 12G. Techniques for doing the segmentation include, but are not limited to, laser scribing, mechanical scribing, optical lithography accompanied by wet chemical etching, sputter etching or ion beam etching. After segmenting the wavelength conversion layer, wavelength conversion chips 50 are formed that include optional vias and/or light extracting elements. The wavelength conversion chips are illustrated in side cross-sectional views in FIGS. 12H and 12I and in a top plan view in FIG. 12J. The wavelength conversion chip includes a wavelength conversion layer that has a bottom surface 52, side surfaces 56, top surface 54, via 82 and light extracting elements 80.

Figure 12J:
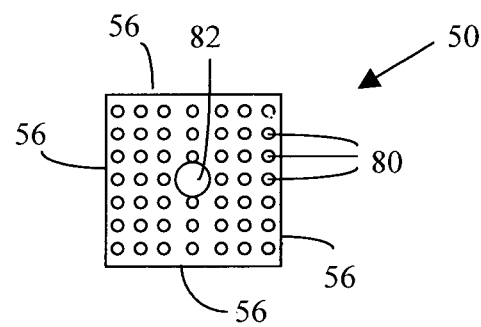

FIG. 12J illustrates a square shaped wavelength conversion chip. However, the wavelength conversion chips may have any shape including, but not limited to, a square, a rectangle, a polygon, a circle, an oval.

Another embodiment of this invention is a process shown in FIGS. 13A-13J for forming wavelength conversion chips that optionally include at least one electrical connection and/or electrical bond pad on the surface of the chip.

The elements with the same numerical reference in FIG. 13 as in FIGS. 1 and 10 are the same elements as in FIGS. 1 and 10 and have the same properties as the elements in FIGS. 1 and 10. Some of the steps of the process shown in FIG. 13 are identical to the process steps outlined above in FIG. 10. In particular, the step of selecting a substrate 10 in FIG. 13A is identical to the step described for FIG. 10A. The step of depositing a wavelength conversion layer 20 on the substrate in FIG. 13B is identical to the step described for FIG. 10B. The step of removing the wavelength conversion layer from the substrate in FIG. 13C is identical to the step described for FIG. 10C. The step of optionally annealing the wavelength conversion layer in FIG. 13D is identical to the step described for FIG. 10D.

The next step following the optional annealing step is to form one or more electrical connections and/or one or more electrical bond pads on the wavelength conversion layer 20. Electrical bond pad 1320 is illustrated in FIGS. 13E-13J. Electrical connection 1310 is illustrated in FIGS. 13G and 13J. Electrical bond pad 1320 and electrical connection 1310 are positioned on surface 24 of the wavelength conversion layer 20. Electrical bond pads and/or electrical connections may be required to bond a wavelength conversion chip to the surface of an LED such as LED 100 in FIG. 5A without using vias. An electrical pathway can be formed along the surface of the wavelength conversion layer of the wavelength conversion chip to electrode 102 even if the chip covers the electrode.

Electrical bond pads and electrical connections can be fabricated from materials that have high electrical conductivity. Materials with high electrical conductivity include, but are not limited to, metals, graphite, graphene, carbon nanotubes and transparent conductive oxides (TCOs). The electrical bond pads and electrical connections can be fabricated by first depositing a highly conductive film by techniques such as electron beam evaporation, sputtering, chemical vapor deposition or spin coating. The conductive film can then be patterned by standard lithographic techniques including, but not limited to, optical lithography accompanied by wet chemical etching, sputter etching or ion beam etching and by pulsed laser etching.

Another way (not illustrated) to make an electrical connection on a wavelength conversion layer or chip is to etch a groove into surface 24 of the wavelength conversion layer or surface 54 of the wavelength conversion chip and press an electrical wire or other type of electrode into the resulting groove. The groove may be formed by techniques that include, but are not limited to, laser ablation, mechanical etching, optical lithography accompanied by wet chemical etching, sputter etching or ion beam etching. An adhesive may be required to hold the electrical wire or electrode in the groove.

Figure 13A:
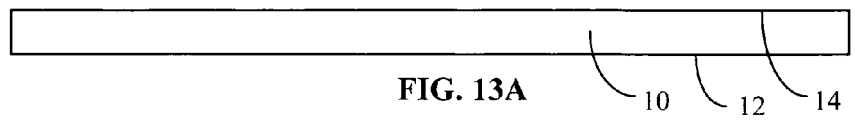
FIGS. 13A-13F are side cross-sectional views illustrating process steps needed to fabricate a wavelength conversion layer that includes electrical connections (not shown) and electrical bond pads.
Figure 13B:
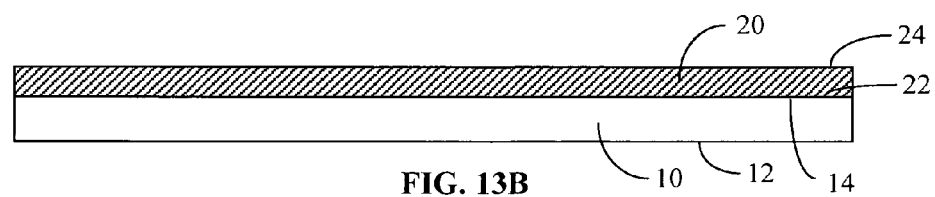
Figure 13C:
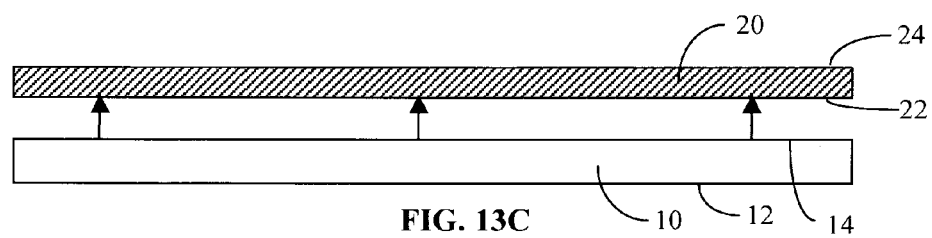
Figure 13D:
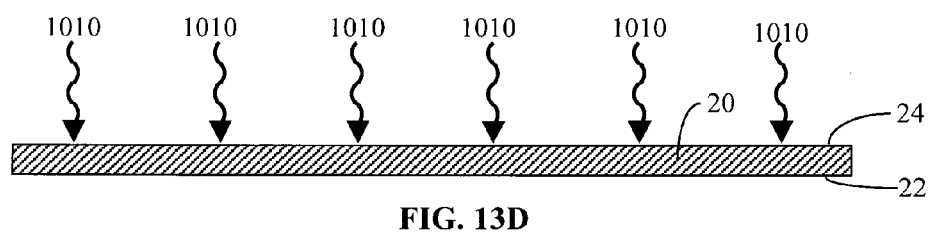
Figure 13E:
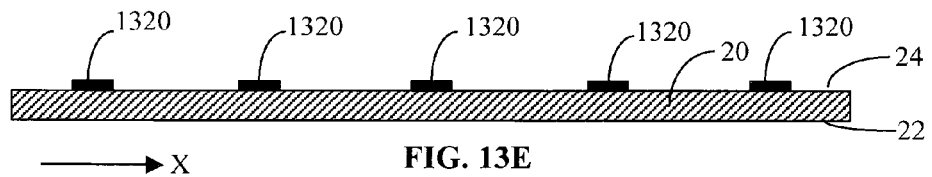
Figure 13F:
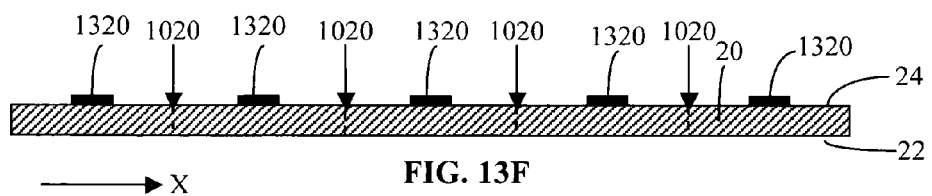
Figure 13G:
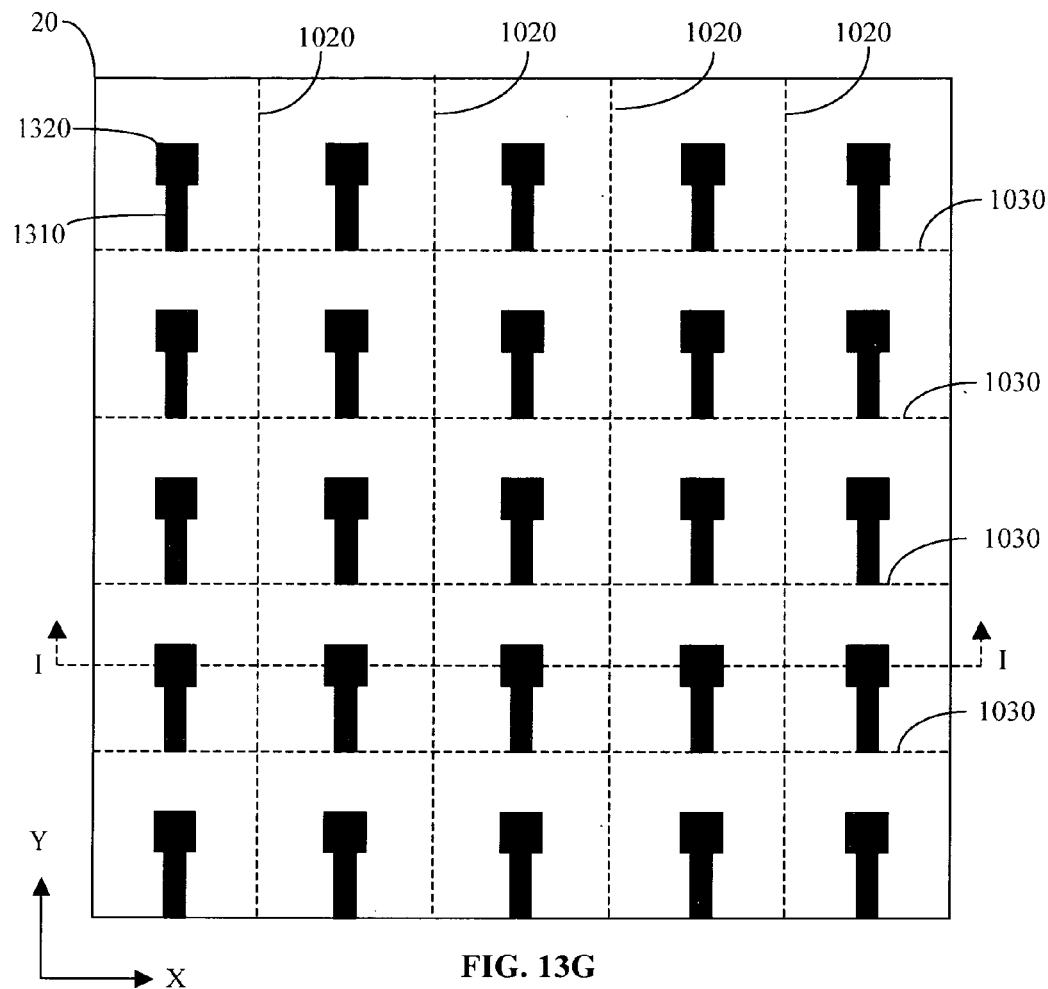
FIG. 13G is a top plan view of a wavelength conversion layer before it is segmented into wavelength conversion chips. The wavelength conversion layer includes electrical connections and electrical bond pads.
Figure 13H:
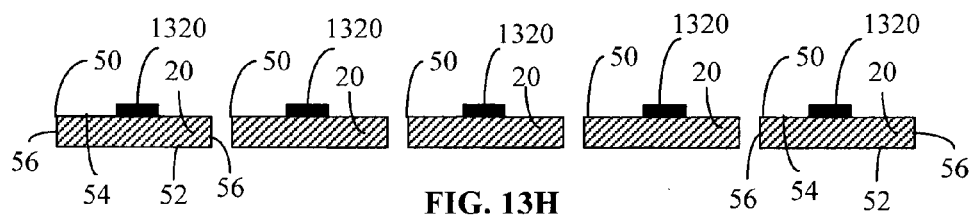
FIG. 13H is a side cross-sectional view of an array of wavelength conversion chips after segmentation. The wavelength conversion chips each have an electrical bond pad and an electrical connection (not shown).

Electrical bond pads are shown in FIG. 13E to be fabricated in a process step that occurs after the optional annealing step for the wavelength conversion layer 20. However, it is within the scope of this invention that the fabrication of electrical connections and/or electrical bond pads may occur at other points in the overall process. For example, fabrication of electrical connections and electrical bond pads may be done before the annealing step or after the wavelength conversion layer is segmented into wavelength conversion chips.

Figure 13I:
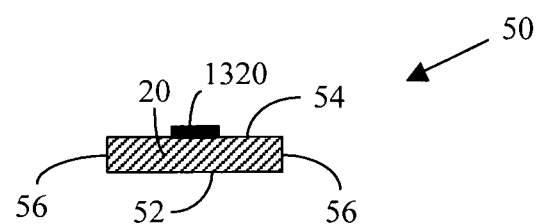
FIG. 13I is a side cross-sectional view and FIG. 13J is a top plan view of a wavelength conversion chip made by the process illustrated in FIGS. 13A-13H. The wavelength conversion chip has an electrical connection and an electrical bond pad.
Figure 13J:
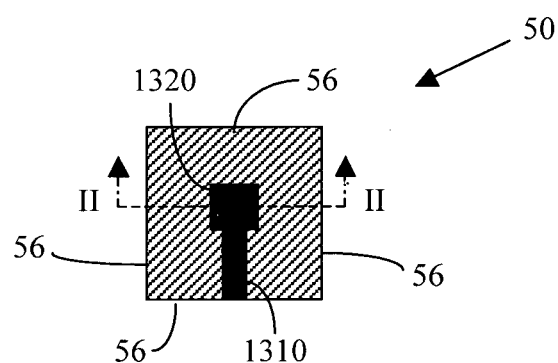

The next process step is to segment the wavelength conversion layer 20 into a plurality of wavelength conversion chips 50. Segmentation can be done in both the X and Y directions indicated in FIG. 13G. For example, the segmentation can occur through the wavelength conversion layer at the dashed lines 1020 illustrated in the side cross-sectional view in FIG. 13F and in the top plan view in FIG. 13G. The segmention can also occur along the dashed lines 1030 shown in FIG. 13G. Techniques for doing the segmentation include, but are not limited to, laser scribing, mechanical scribing, optical lithography accompanied by wet chemical etching, sputter etching or ion beam etching. After segmenting the wavelength conversion layer, wavelength conversion chips 50 are formed that include optional vias and/or light extracting elements. The wavelength conversion chips are illustrated in side cross-sectional views in FIGS. 13H and 13I and in a top plan view in FIG. 13J. The cross-sectional view in FIG. 13I is along the II-II plane shown in FIG. 13J. The wavelength conversion chip includes a wavelength conversion layer that has a bottom surface 52, side surfaces 56, top surface 54, electrical connection 1310 and electrical bond pad 1320.

FIG. 13J illustrates a square shaped wavelength conversion chip. However, the wavelength conversion chips may have any shape including, but not limited to, a square, a rectangle, a polygon, a circle, an oval.

While the invention has been described with the inclusion of specific embodiments and examples, it is evident to those skilled in the art that many alternatives, modifications and variations will be evident in light of the foregoing descriptions. Accordingly, the invention is intended to embrace all such alternatives, modifications and variations that fall within the spirit and scope of the appended claims.

What is claimed is:

1. A wavelength conversion element for use in a solid-state light source having at least one light-emitting diode, the wavelength conversion element comprising:

a wavelength conversion chip having at least first and second surfaces, wherein the first surface is usable to affix the wavelength conversion chip to at least one light-emitting diode, and wherein the wavelength conversion chip converts at least a portion of light emitted from the at least one light-emitting diode to light of a different wavelength range;

electrical connection means for making electrical contact with the at least one light-emitting diode, wherein said electrical connection means is on the second surface of the wavelength conversion chip:

wherein the electrical connection means includes a via formed through the wavelength conversion chip and a conductive material formed in the via to provide electrical connection to a light-emitting diode.

* * * * *